(12) United States Patent
Zeng et al.

(10) Patent No.: US 10,447,166 B2
(45) Date of Patent: Oct. 15, 2019

(54) POWER MODULE

(71) Applicant: DELTA ELECTRONICS, INC., Taoyuan (TW)

(72) Inventors: Jianhong Zeng, Taoyuan (TW); Haoyi Ye, Taoyuan (TW); Peiqing Hu, Taoyuan (TW); Pengkai Ji, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 60 days.

(21) Appl. No.: 15/819,507

(22) Filed: Nov. 21, 2017

(65) Prior Publication Data
US 2018/0076718 A1 Mar. 15, 2018

Related U.S. Application Data

(63) Continuation-in-part of application No. 14/840,063, filed on Aug. 31, 2015, now Pat. No. 9,977,476, and
(Continued)

(30) Foreign Application Priority Data

Nov. 25, 2016 (CN) .......................... 2016 1 1058669

(51) Int. Cl.
*H02M 3/00* (2006.01)
*H02M 3/335* (2006.01)
(Continued)

(52) U.S. Cl.
CPC .......... *H02M 3/33507* (2013.01); *G06F 1/20* (2013.01); *G06F 1/26* (2013.01); *G09G 1/005* (2013.01);
(Continued)

(58) Field of Classification Search
None
See application file for complete search history.

(56) References Cited

U.S. PATENT DOCUMENTS

2002/0131258 A1 9/2002 Inoue et al.
2008/0052551 A1* 2/2008 Chapuis .................... G06F 1/26
 713/340
(Continued)

FOREIGN PATENT DOCUMENTS

CN 1332512 A 1/2002
CN 101465743 A 6/2009
(Continued)

*Primary Examiner* — Paul B Yanchus, III
(74) *Attorney, Agent, or Firm* — Kirton McConkie; Evan R. Witt

(57) ABSTRACT

A power module includes a circuit board and a load group. The load group is installed on the circuit board. The load group includes a first-stage power conversion circuit, a second-stage power conversion circuit and plural loads. The first-stage power conversion circuit converts an input voltage into a transition voltage. The second-stage power conversion circuit converts the transition voltage into a driving voltage. A rated value of the first input voltage is higher than twice a rated value of the transition voltage. A rated value of the driving voltage is lower than a half of the rated value of the transition voltage. The distance between the input terminal of the second-stage power conversion circuit and the output terminal of the first-stage power conversion circuit is smaller than the distance between the input terminal of the first-stage power conversion circuit and each edge of the circuit board.

28 Claims, 20 Drawing Sheets

Related U.S. Application Data a continuation-in-part of application No. 15/134,478, filed on Apr. 21, 2016.

(51) Int. Cl.

| | | |
|---|---|---|
| *H05K 1/14* | (2006.01) | |
| *G09G 1/00* | (2006.01) | |
| *H02M 3/158* | (2006.01) | |
| *H02M 7/04* | (2006.01) | |
| *H02M 7/49* | (2007.01) | |
| *H02M 1/42* | (2007.01) | |
| *G06F 1/20* | (2006.01) | |
| *G06F 1/26* | (2006.01) | |
| *H02M 1/00* | (2006.01) | |
| *H05K 1/02* | (2006.01) | |

(52) U.S. Cl.
CPC ......... *H02M 1/4225* (2013.01); *H02M 3/158* (2013.01); *H02M 7/04* (2013.01); *H02M 7/49* (2013.01); *H05K 1/141* (2013.01); *H05K 1/144* (2013.01); *H02M 2001/007* (2013.01); *H02M 2001/0032* (2013.01); *H02M 2001/0096* (2013.01); *H05K 1/0263* (2013.01)

(56) References Cited

U.S. PATENT DOCUMENTS

| | | |
|---|---|---|
| 2008/0101025 A1 | 5/2008 | Harris et al. |
| 2012/0173892 A1 | 7/2012 | Tong et al. |
| 2016/0160828 A1 | 6/2016 | Betscher et al. |

FOREIGN PATENT DOCUMENTS

| | | |
|---|---|---|
| CN | 101651031 A | 2/2010 |
| CN | 101895191 A | 11/2010 |
| CN | 101777844 B | 4/2012 |
| CN | 103107777 A | 5/2013 |
| CN | 103596365 A | 2/2014 |
| CN | 103824853 A | 5/2014 |
| CN | 103872036 A | 6/2014 |
| CN | 103872919 A | 6/2014 |
| CN | 104038070 A | 9/2014 |
| CN | 104111715 A | 10/2014 |
| CN | 104253536 A | 12/2014 |
| CN | 104638944 A | 5/2015 |
| CN | 105790586 A | 7/2016 |
| CN | 106026350 A | 10/2016 |
| GB | 2 399 684 A | 9/2004 |
| TW | M253836 U | 12/2004 |
| TW | 200534570 A | 10/2005 |
| TW | 201505345 A | 2/2015 |

\* cited by examiner

POWER MODULE

CROSS-REFERENCE TO RELATED APPLICATION

This application claims priority to China Patent Application No. 201611058669.1, filed on Nov. 25, 2016. This application is a continuation-in-part application of U.S. application Ser. No. 14/840,063 filed on Aug. 31, 2015, and entitled "POWER SUPPLY APPARATUS". This application is also a continuation-in-part application of U.S. application Ser. No. 15/134,478 filed on Apr. 21, 2016, and entitled "POWER CONVERTER". The entire contents of the above-mentioned patent applications are incorporated herein by reference for all purposes.

FIELD OF THE DISCLOSURE

The present disclosure relates to a power module, and more particularly to a power module with reduced power loss, high efficiency and small volume.

BACKGROUND OF THE DISCLOSURE

As the human's demands on smart lives gradually increase, the data processing capability becomes more important. Generally, the global energy consumption in data processing reaches hundreds of billions or even several trillion kilowatt-hours per year. A large data center occupies an area of several tens of thousands of square meters. Consequently, it is important to develop a data center with high efficiency and high power density.

The key component unit of the data center is a server. A main board of the server is usually equipped with central processing units (CPUs), chipsets, memories, data processing chips, a power supply and the essential peripheral components. These electronic components are installed on the main board. Moreover, the data center comprises plural servers. Generally, a bus bar is shared by some servers. The plural servers all receive electric power from the bus bar.

FIG. 1 schematically illustrates the first conventional architecture of a rack in a data center. In a rack 5 of a data center, a bus bar 51 is shared by plural servers 50. The voltage of the bus bar 51 is a 12V-DC voltage. The 12V-DC voltage is transmitted to the input terminal of the circuit board of each server 50. Moreover, the 12V-DC voltage is further transmitted to a point-of-load (POL) conversion module 52 through traces (e.g., copper lines) and then transmitted to the load 53 of the corresponding server 50. For saving the resources of the main board, the main board usually has no extra copper layers to form the traces. That is, the resistance of the traces Rtrace on the main board is usually high. The high trace resistance Rtrace results in obvious power transmission loss. Moreover, since the 12V-DC voltage provided to the bus bar 51 is low, the current flowing through the bus bar 51 is relatively higher. For example, the current of a 1.2KW-server is up to 100 A when the input voltage is 12V. Since the integration of the main board is different, the efficiency of the main board will decrease by about 0.5%~2%. As the demands on the data processing capability of the main board increase, the problem of efficiency reduction becomes more serious. Moreover, the POL conversion module 52 usually comprises a 12V-buck converter for receiving the 12V-DC voltage. As known, the 12V-buck converter is not suitable for development of the high-integration servers. As mentioned above, the main board of the server is usually equipped with CPUs, chipsets, memories, data processing chips, a POL conversion module and the essential peripheral components. As the processing capability of the server increases, the number and the volume of the processing chips increase. Under this circumstance, the layout space and the power consumption increase. It is important that the POL conversion module for these chips should have higher efficiency and smaller volume. However, since the working voltages of these chips are usually lower than 2V or even lower than 1V, the voltage difference between the input terminal and the output terminal of the 12V-buck converter is very large. That is, it is difficult to achieve both purposes of high efficiency and small volume. Moreover, the 12V-buck converter usually uses high-voltage MOS components (e.g., 25~30V). Since the working efficiency is usually several kHz, the conventional POL conversion module is not suitable for the development of the high speed data processing chip.

FIG. 2 schematically illustrates the second conventional architecture of a rack in a data center. For solving the above drawbacks, it is necessary to increase the voltage of the bus bar 51. For example, if the voltage of the bus bar 51 increases to 48V, the power loss will decrease by about 1/16. If the voltage of the bus bar 51 increases to 400V, the efficacy of the power loss reduction is more obvious. As shown in FIG. 2, the voltage of the bus bar 51 increases to 48V. Moreover, the input terminal of the circuit board of each server 50 is connected with a DC/DC converter 54. By the DC/DC converter 54, the 48V is converted into 12V-DC voltage. The 12V-DC voltage is further transmitted to the POL conversion module 52 through traces and then transmitted to the load 53 of the corresponding server 50.

Since the voltage of the bus bar 51 increases to 48V and the 48V is converted into 12V-DC voltage by the DC/DC converter 54, the drawbacks of using the 12V-DC voltage also exist. In additional, some new problems occur. For example, the high trace resistance Rtrace also results in obvious power transmission loss. Moreover, since the POL conversion module 52 also uses the 12V-buck converter, it is difficult to achieve both purposes of high efficiency and small volume and the conventional POL conversion module is not suitable for the development of the high speed data processing chip. Moreover, since the volume of the DC/DC converter 54 is bulky, it is difficult to install the DC/DC converter 54 on the circuit board. For installing the DC/DC converter 54, it is necessary to increase the size of the circuit board, which is detrimental to the miniaturization of the server.

Therefore, there is a need of providing an improved power module in order to overcome the above drawbacks.

SUMMARY OF THE DISCLOSURE

The present disclosure provides a power module for increasing the efficiency of the server and facilitating the miniaturization of the server.

In accordance with an aspect of the present disclosure, there is provided a power module. The power module includes a first circuit board and at least one first load group. The at least one first load group is installed on a first surface of the first circuit board. Each first load group includes a first-stage power conversion circuit, at least one second-stage power conversion circuit and plural loads. The first-stage power conversion circuit is installed on the first surface of the first circuit board. An input terminal of the first-stage power conversion circuit receives a first input voltage. The first input voltage is converted into a transition voltage by the first-stage power conversion circuit. The transition voltage is outputted from an output terminal of the first-stage power conversion circuit. The at least one second-stage power conversion circuit is installed on the first surface of the first circuit board and located near the first-stage power conversion circuit. An input terminal of the second-stage power conversion circuit is electrically connected with the output terminal of the first-stage power conversion circuit to receive the transition voltage. The transition voltage is converted into a driving voltage by the second-stage power conversion circuit. The driving voltage is outputted from an output terminal of the second-stage power conversion circuit. The plural loads are installed on the first surface of the first circuit board. The output terminal of each second-stage power conversion circuit is connected with the corresponding load. Each load receives the driving voltage from the corresponding second-stage power conversion circuit. A rated value of the first input voltage is higher than twice a rated value of the transition voltage. A rated value of the driving voltage is lower than a half of the rated value of the transition voltage. A distance between the input terminal of the at least one second-stage power conversion circuit with the highest rated power and the output terminal of the first-stage power conversion circuit is smaller than a distance between the input terminal of the first-stage power conversion circuit and each edge of the circuit board.

In accordance with another aspect of the present disclosure, there is provided a power module. The power module includes a first circuit board and at least one first load group. The at least one first load group is installed on a first surface of the first circuit board. Each first load group includes a first-stage power conversion circuit, at least one second-stage power conversion circuit and plural loads. The first-stage power conversion circuit is installed on the first surface of the first circuit board. An input terminal of the first-stage power conversion circuit receives a first input voltage. The first input voltage is converted into a transition voltage by the first-stage power conversion circuit. The transition voltage is outputted from an output terminal of the first-stage power conversion circuit. The at least one second-stage power conversion circuit is installed on the first surface of the first circuit board and located near the first-stage power conversion circuit. An input terminal of the second-stage power conversion circuit is electrically connected with the output terminal of the first-stage power conversion circuit to receive the transition voltage. The transition voltage is converted into a driving voltage by the second-stage power conversion circuit. A driving voltage is outputted from an output terminal of the second-stage power conversion circuit. The plural loads are installed on the first surface of the first circuit board. The output terminal of each second-stage power conversion circuit is connected with the corresponding load. Each load receives the driving voltage from the corresponding second-stage power conversion circuit. A rated value of the first input voltage is higher than twice a rated value of the transition voltage. A rated value of the driving voltage is lower than a half of the rated value of the transition voltage. A resistance between the output terminal of the first-stage power conversion circuit and the input terminal of the at least one second-stage power conversion circuit with the highest rated power in each first load group is lower than a resistance between the output terminals of the two first-stage power conversion circuits of the two first load groups.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
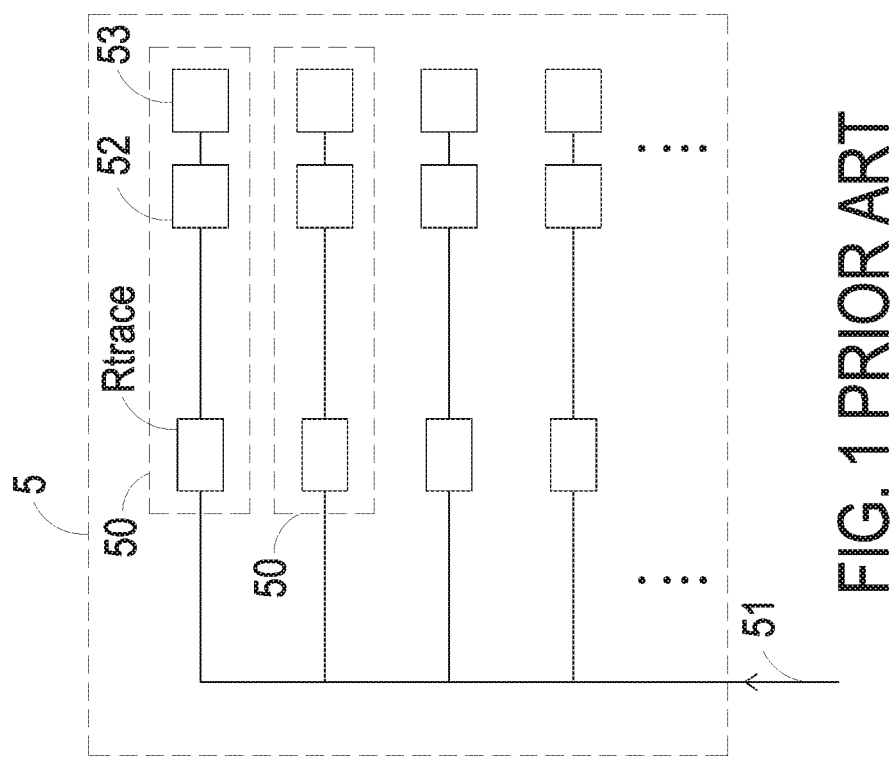
FIG. 1 schematically illustrates the first conventional architecture of a rack in a data center.
Figure 2:
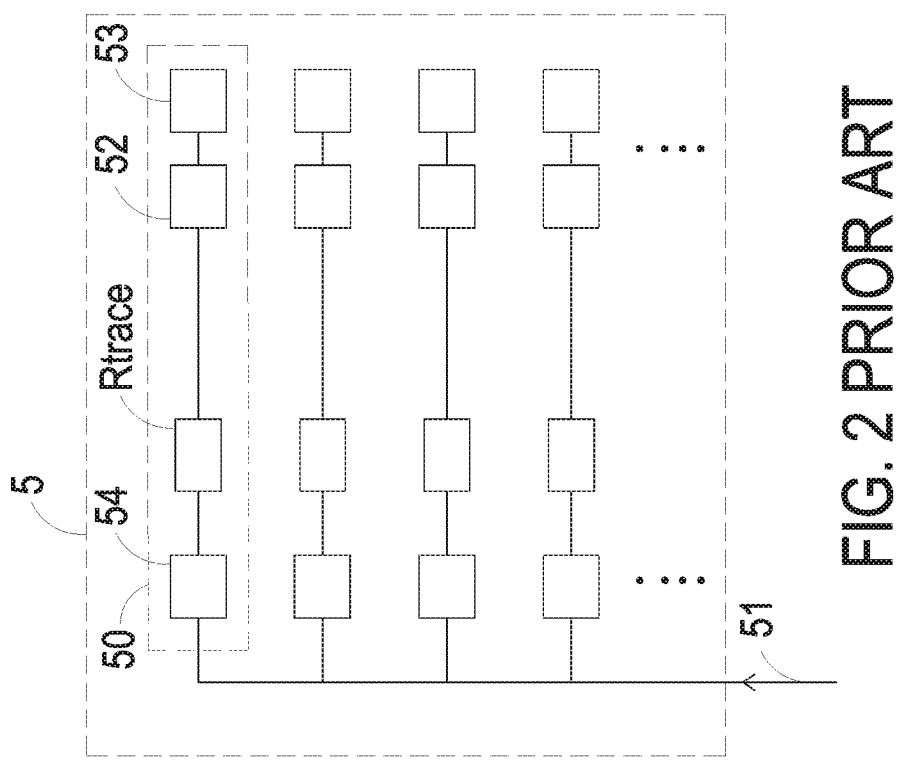
FIG. 2 schematically illustrates the second conventional architecture of a rack in a data center.
Figure 3:
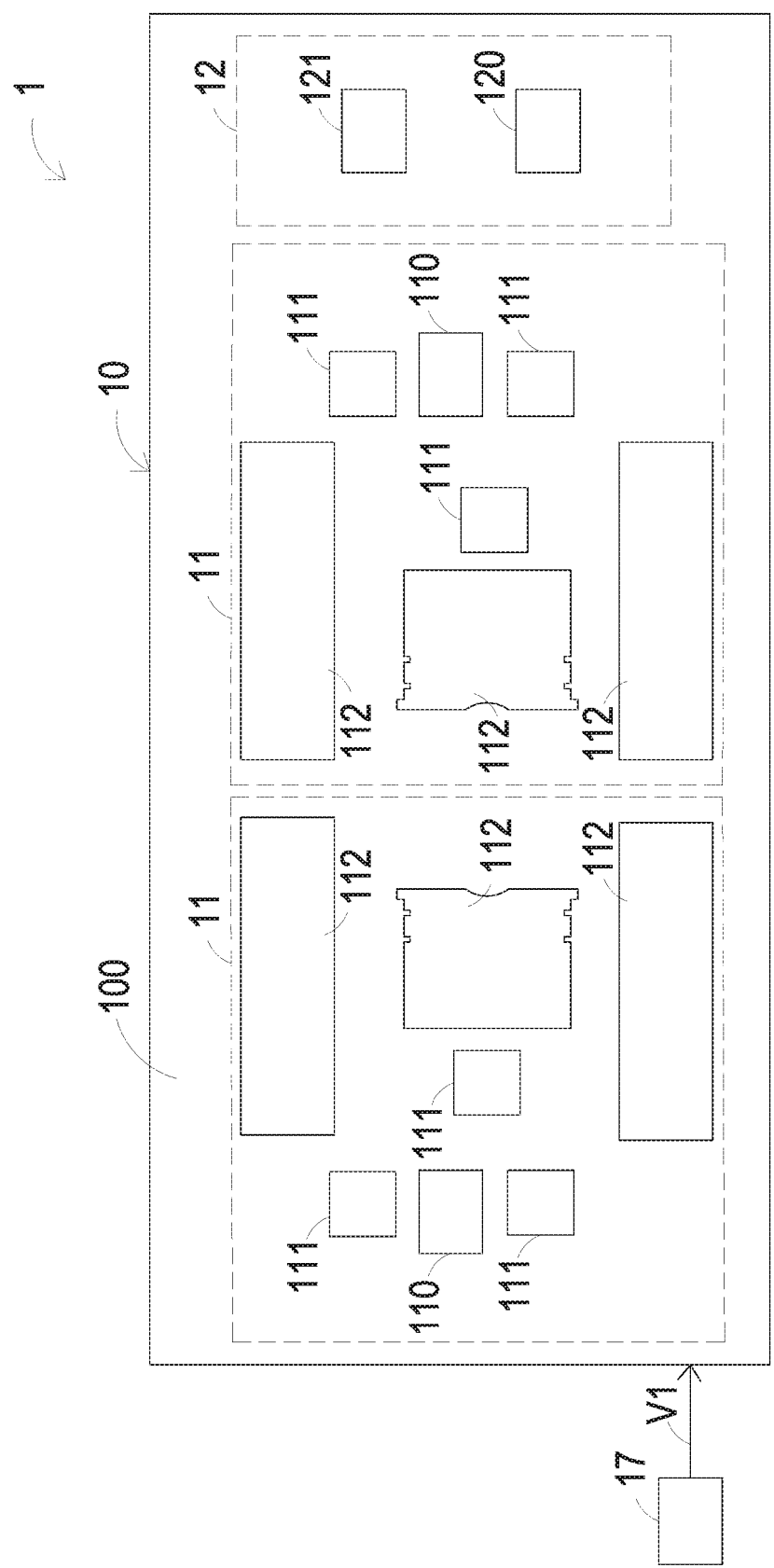
FIG. 3 is a schematic circuit block diagram illustrating the architecture of a power module according to an embodiment of the present disclosure.

FIG. 3 is a schematic circuit block diagram illustrating the architecture of a power module according to an embodiment of the present disclosure. Preferably but not exclusively, the power module 1 is applied to a server of a data center. As shown in FIG. 3, the power module 1 comprises a first circuit board 10 and at least one first load group 11. The first circuit board 10 has traces (not shown) for transferring electric energy and signals. An input terminal of the first circuit board 10 receives a first input voltage V1 from a power supply 17. In this embodiment, the at least one first load group 11 comprises two first load groups 11. The two first load groups 11 are installed on a first surface 100 of the first circuit board 10 through welding means or sockets (not shown). In an embodiment, each first load group 11 comprises a first-stage power conversion circuit 110, at least one second-stage power conversion circuit 111 and plural loads 112.

The first-stage power conversion circuit 110 is installed on the first surface 100 of the first circuit board 10. The input terminal of the first-stage power conversion circuit 110 receives the first input voltage V1 through the corresponding traces of the first circuit board 10. The first-stage power conversion circuit 110 is used for converting the first input voltage V1 into a transition voltage. The transition voltage is outputted from an output terminal of the first-stage power conversion circuit 110.

In the embodiment of FIG. 3, each first load group 11 comprises three second-stage power conversion circuits 111. The second-stage power conversion circuits 111 are installed on the first surface 100 of the first circuit board 10 and located near the first-stage power conversion circuit 110. The input terminal of the second-stage power conversion circuit 111 is electrically connected with the output terminal of the first-stage power conversion circuit 110 through the corresponding traces of the first circuit board 10. Consequently, the second-stage power conversion circuit 111 receives the transition voltage from the first-stage power conversion circuit 110. The second-stage power conversion circuit 111 is used for converting the transition voltage into a driving voltage. The driving voltage is outputted from the output terminal of the second-stage power conversion circuit 111.

In this embodiment, the distance between the input terminal of the at least one second-stage power conversion circuit 111 with the highest rated power and the output terminal of the first-stage power conversion circuit 110 is smaller than the distance between the input terminal of the first-stage power conversion circuit 110 and each edge of the first circuit board 10.

Moreover, the rated value of the first input voltage V1 is higher than twice the rated value of the transition voltage, and the rated value of the driving voltage is lower than a half of the rated value of the transition voltage. The first-stage power conversion circuit 110 and at least one second-stage power conversion circuit 111 of each first load group 11 are collaboratively defined as a point-of-load (POL) conversion module.

In this embodiment, each first load group 11 comprises three loads 112. These loads 112 are installed on the first surface 100 of the first circuit board 10. The output terminal of each second-stage power conversion circuit 111 is electrically connected with the corresponding load 112 through the corresponding traces of the first circuit board 10. The driving voltage is transmitted from the second-stage power conversion circuit 111 to the corresponding load 112. Consequently, the load 112 can be normally operated.

It is noted that the first load groups 11 can be installed on the second surface of the first circuit board 10, and the second surface is opposite to the first surface 100. That is to say the first load groups 11 can be installed on two surfaces of the first circuit board 10. Of course, the first-stage power conversion circuit 110, the second-stage power conversion circuits 111 and the loads 112 included in the first load group 11 can be installed on both surfaces of the first circuit board 10. The volume of the first circuit board 10 is reduced by installing electronic devices on two surfaces.

For example, the rated value of the first input voltage V1 is in the range between 8V and 18V (for example 12V), the rated value of the transition voltage is in the range between 2V and 8V (for example 5V), and the rated value of the driving voltage is below 2V.

For example, the rated value of the first input voltage V1 is at least higher than 18V (for example 48V), the rated value of the transition voltage is in the range between 3V and 8V (for example 5V), and the rated value of the driving voltage is 1V or 1.8V.

In an embodiment, the plural loads 112 of each first load group 11 are included in a data processing chip. For example, the load 112 is a central processing unit (CPU), a chipset or a memory. In an embodiment, the first-stage power conversion circuit 110 and the second-stage power conversion circuits 111 are DC/DC buck converters. As shown in FIG. 3, the first-stage power conversion circuit 110 and the second-stage power conversion circuits 111 are located near an edge of the first circuit board 10, and the plural loads 112 are located near the other edges of the first circuit board 10. Since the rated value of the first input voltage V1 received by the power module 1 is higher than the input voltage of the conventional technology (e.g., 12V), the power module 1 of the present disclosure has reduced power loss and enhanced performance. According to the conventional technology, the input voltage (e.g., 12V) from the power supply is converted into a working voltage (e.g., 2V or 1V) to the load. Since a transition voltage with lower level is generated and the voltage difference between the input terminal and the output terminal of the second-stage power conversion circuits 111 of the power module 1 is reduced, the working efficiency of the second-stage power conversion circuits 111 largely increases. The working efficiency obviously increases when the power module 1 is operated at a higher frequency. As mentioned above, the distance between the input terminal of the at least one second-stage power conversion circuit 111 with the highest rated power and the output terminal of the first-stage power conversion circuit 110 is smaller than the distance between the input terminal of the first-stage power conversion circuit 110 and each edge of the circuit board 10. Since the electric transmission path between the first-stage power conversion circuit 110 and the second-stage power conversion circuit 111 is shorter, the power loss is reduced and the working efficiency is enhanced when the transition voltage is transmitted from the first-stage power conversion circuit 110 to the second-stage power conversion circuit 111 through the corresponding traces of the first circuit board 10.

Moreover, since the rated value of the transition voltage is in the range between 2V and 8V, the semiconductor components operated at 2V~8V can be used as the switching elements of the second-stage power conversion circuit 111. Under this circumstance, the working frequency of the second-stage power conversion circuit 111 largely increases while maintaining the desired efficiency. Moreover, since the volume of the second-stage power conversion circuit 111 is reduced, the second-stage power conversion circuit 111 can be placed at a position closer to the load 112. Consequently, the power loss caused by the traces of the first circuit board 10 is reduced. Moreover, since the ability of the second-stage power conversion circuit 111 to quickly adjust the output voltage is achieved, the power loss of the load 112 is reduced. Moreover, since the second-stage power conversion circuit 111 used in the power module 1 is the buck converter corresponding to the low voltage, the second-stage power conversion circuit 111 has stronger voltage-adjusting capability. That is, the volume of the second-stage power conversion circuit 111 can be flexibly varied according to the overall power level, and the transition voltage received by the second-stage power conversion circuit 111 can have large fluctuation. On the other hand, the first-stage power conversion circuit 110 does not need to have the strong voltage-adjusting capability. That is, the first-stage power conversion circuit 110 may only have the function of loosely adjusting the transition voltage. In some embodiments, the first-stage power conversion circuit 110 is a resonant circuit, and it is not necessary to adjust the fluctuation of the transition voltage.

In an embodiment, the power module 1 comprises two first load groups 11. For reducing the power loss of the power module 1, the resistance between the output terminal of the first-stage power conversion circuit 110 and the input terminal of the at least one second-stage power conversion circuit 111 with the highest rated power in each first load group 11 is lower than the resistance between the output terminals of the two first-stage power conversion circuits 110 of the two first load groups 11.

In another embodiment, the power module 1 also comprises two first load groups 11. For reducing the power loss of the power module 1, the resistance between the output terminal of the first-stage power conversion circuit 110 and the input terminal of the at least one second-stage power conversion circuit 111 with the highest rated power in each first load group 11 is lower than the resistance between the input terminals of the two first-stage power conversion circuits 110 of the two first load groups 11.

Moreover, for reducing the power loss of the power module 1, the length of the electric transmission path between the first-stage power conversion circuit 110 and the second-stage power conversion circuit 111 is preferably smaller than 5 centimeters.

As mentioned above, since the voltage level of the first input voltage V1 received by the first circuit board 10 increases, the power loss caused by the traces of the first circuit board 10 is reduced. Moreover, since the voltage level of the transition voltage received by the second-stage power conversion circuit 111 is decreased, the efficiency of the second-stage power conversion circuit 111 is enhanced. In accordance with a feature, the overall required power of the at least one first load group 11 is at least 50%, and preferably at least 70% of the overall required power of the first circuit board 10. As mentioned above, in case that the volume of the second-stage power conversion circuit 111 is reduced, the second-stage power conversion circuit 111 is closer to the load 112 and the power loss caused by the traces of the first circuit board 10 is further reduced. For achieving this purpose, the current provided to the data processing chip including the plural loads 112 must be large enough. For example, the current is at least 30 A, and preferably at least 100 A. Moreover, as the voltage level of the first input voltage V1 received by the first circuit board 10 increases, the efficacy of reducing the power loss of the first circuit board 10 increases. The rated value of the first input voltage V1 is at least 8V, preferably at least 18V, and the rated value of the transition voltage is in the range between 2V and 8V.

As mentioned above, the second-stage power conversion circuit 111 has stronger voltage-adjusting capability, but the first-stage power conversion circuit 110 does not need to have strong voltage-adjusting capability. In some situations, the first-stage power conversion circuit 110 does not need to have the function of adjusting the transition voltage. In an embodiment, the gain over full load range of the first-stage power conversion circuit 110 is lower than 1.2, and the gain over full load range of the second-stage power conversion circuit 111 is higher than 1.2.

In another embodiment, the second-stage power conversion circuit 111 comprises plural switching elements and a driving element for driving the plural switching elements. The plural switching elements and the driving element are integrated into a silicon chip by a lateral semiconductor manufacturing process.

In an embodiment, each first load group 11 comprises plural second-stage power conversion circuits 111, preferably at least two second-stage power conversion circuits 111, and more preferably at least five second-stage power conversion circuits 111. Moreover, among the plural second-stage power conversion circuits 111, the maximum rated value of the output current is at least 5 times (preferably 10 time) the minimum rated value of the output current.

In case that the first load group 11 comprises at least two loads 112, the at least two loads 112 are independently included in the corresponding package structures, or the at least two loads 112 are collaboratively included in the same package structure or integrated into single silicon chip.

Please refer to FIG. 3 again. The power module 1 further comprises a second load group 12. The second load group 12 is installed on the first surface 100 of the first circuit board 10 and located near the first-stage power conversion circuit 110 of the adjacent first load group 11. In an embodiment, the second load group 12 comprises a first-stage power conversion circuit 120 and a hard drive 121. For example, the hard drive is a conventional hard drive that is driven by 12V. The first-stage power conversion circuit 120 is installed on a first surface 100 of the first circuit board 10. The input terminal of the first-stage power conversion circuit 120 receives the first input voltage V1 through the corresponding traces of the first circuit board 10. The first-stage power conversion circuit 120 is used for converting the first input voltage V1 into a transition voltage. The transition voltage is outputted from an output terminal of the first-stage power conversion circuit 120. The hard drive 121 is electrically connected with the output terminal of the first-stage power conversion circuit 120. The hard drive 121 is powered by the transition voltage from the first-stage power conversion circuit 120. Moreover, the rated value of the first input voltage V1 is higher than twice the rated value of the transition voltage from the first-stage power conversion circuit 120.

Figure 4:
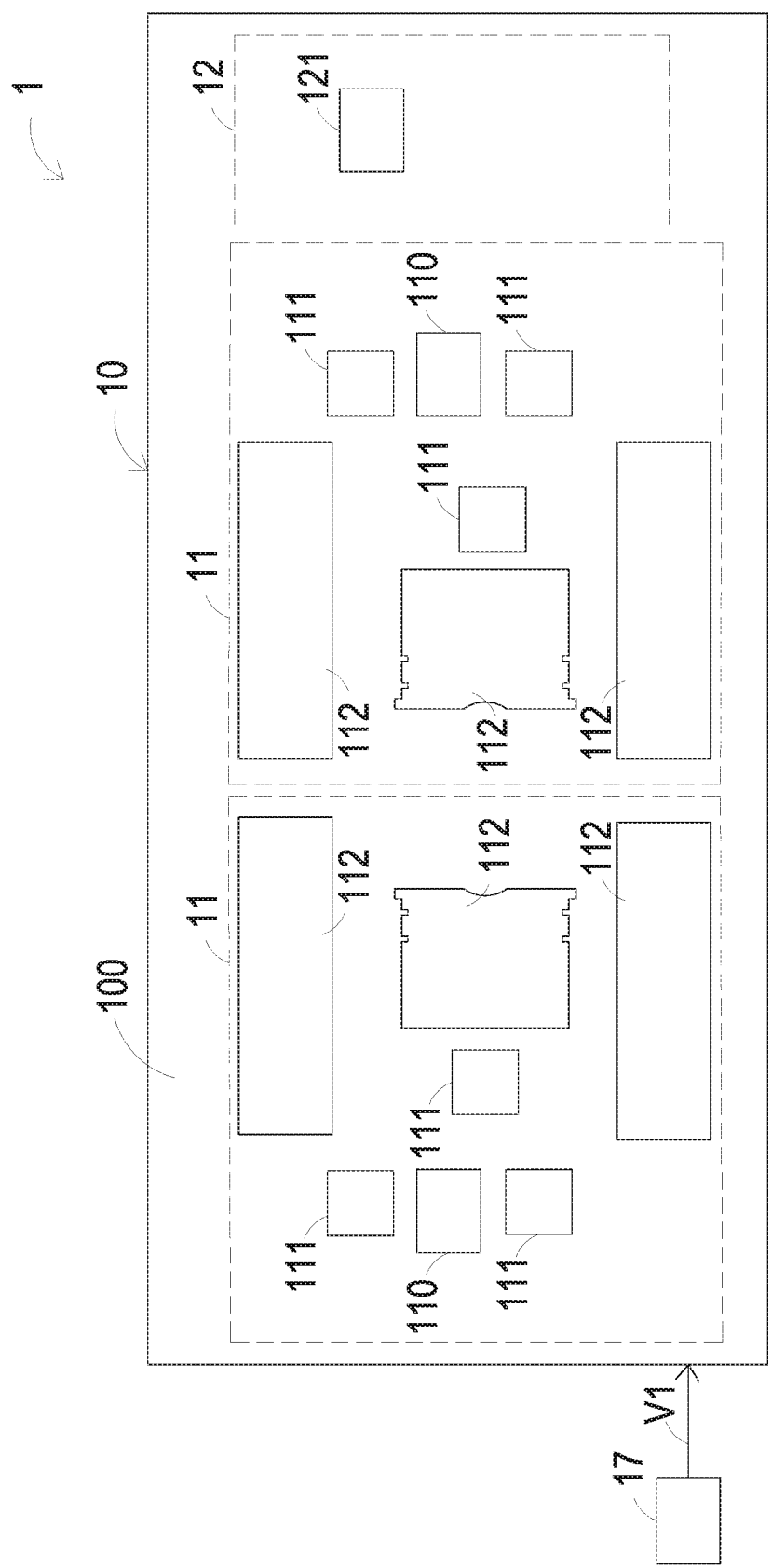
FIG. 4 is a schematic circuit block diagram illustrating the architecture of a first variant example of the power module of FIG. 3.

FIG. 4 is a schematic circuit block diagram illustrating the architecture of a first variant example of the power module of FIG. 3. In comparison with FIG. 3, the hard drive 121 is a semiconductor solid state drive. Generally, the semiconductor solid state drive is driven by a voltage lower than 5V. Consequently, the first-stage power conversion circuit 120 as shown in FIG. 3 is omitted. The semiconductor solid state drive 121 of the second load group 12 is electrically connected with the first-stage power conversion circuit 110 of the adjacent first load group 11, through the corresponding traces of the first circuit board 10. Under this circumstance, the semiconductor solid state drive 121 of the second load group 12 is directly powered by the transition voltage from the first-stage power conversion circuit 110 of the adjacent first load group 11.

Figure 5:
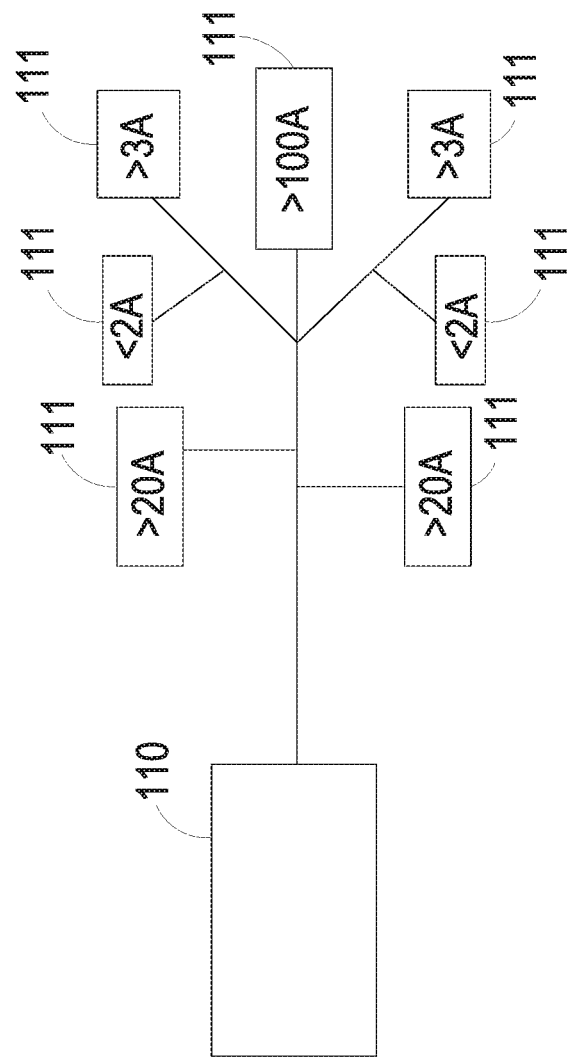
FIG. 5 schematically illustrates the output currents of various second-stage power conversion circuits of the power module as shown in FIG. 3.

FIG. 5 schematically illustrates the output currents of various second-stage power conversion circuits of the power module as shown in FIG. 3. As mentioned above, the plural loads 112 of each first load group 11 are included in a data processing chip. Consequently, these loads 112 in the data processing chip are powered by different output currents through different power supply rails. The voltage and power for these power supply rails are different. For example, if the high power is required, the output current is possibly higher than 100 A. Whereas, if the low power is required, the output current is possibly lower than 2 A. As shown in FIG. 5, each first load group 11 of the power module 1 comprises plural second-stage power conversion circuits 111. According to the practical requirements, the second-stage power conversion circuits 111 provide the required output currents, for example, higher than 3 A, higher than 20 A, higher than 100 A or lower than 2 A. Consequently, the power module 1 of the present disclosure can effectively solve the problems of the multiple power rails. Moreover, since the transition voltage converted by the second-stage power conversion circuits 111 are in the lower range between 5V and 8V, the second-stage power conversion circuits 111 have high efficiency and small volume.

Figure 6:
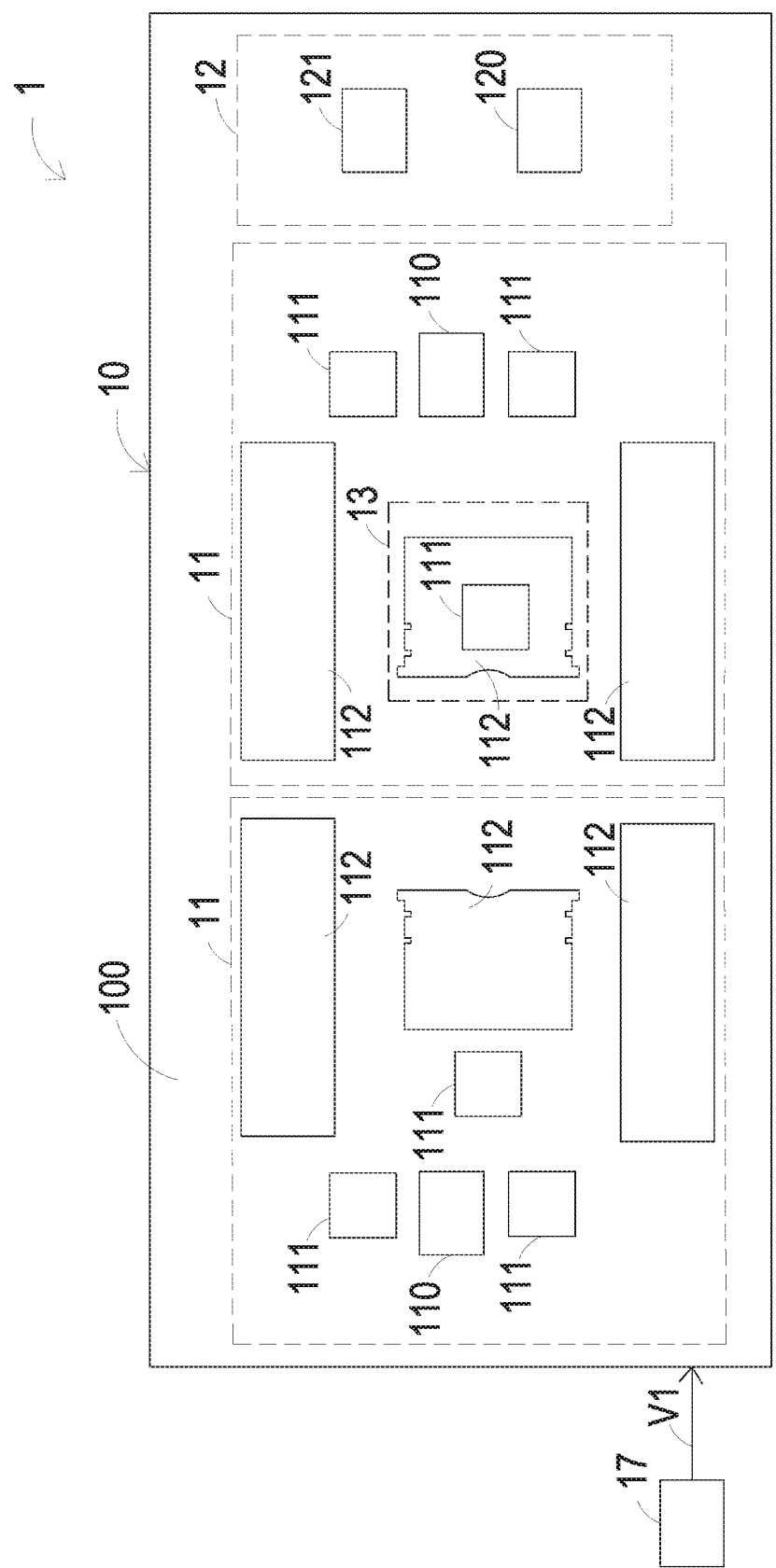
FIG. 6 is a schematic circuit block diagram illustrating the architecture of a second variant example of the power module of FIG. 3.

FIG. 6 is a schematic circuit block diagram illustrating the architecture of a second variant example of the power module of FIG. 3. In this embodiment, the second-stage power conversion circuit 111 can be operated at a high frequency. Consequently, the volume of the second-stage power conversion circuit 111 is very small. In this embodiment, at least one second-stage power conversion circuit 111 of the first load group 11 is located over the corresponding load 112, and the at least one second-stage power conversion circuit 111 and the corresponding load 112 are included in a package structure 13. For example, the package structure 13 is a silicon chip. It is noted that the positions of the at least one second-stage power conversion circuit 111 and the corresponding load 112 may be exchanged. For example, in another embodiment, the at least one second-stage power conversion circuit 111 of the first load group 11 is located under the corresponding load 112.

Figure 7:
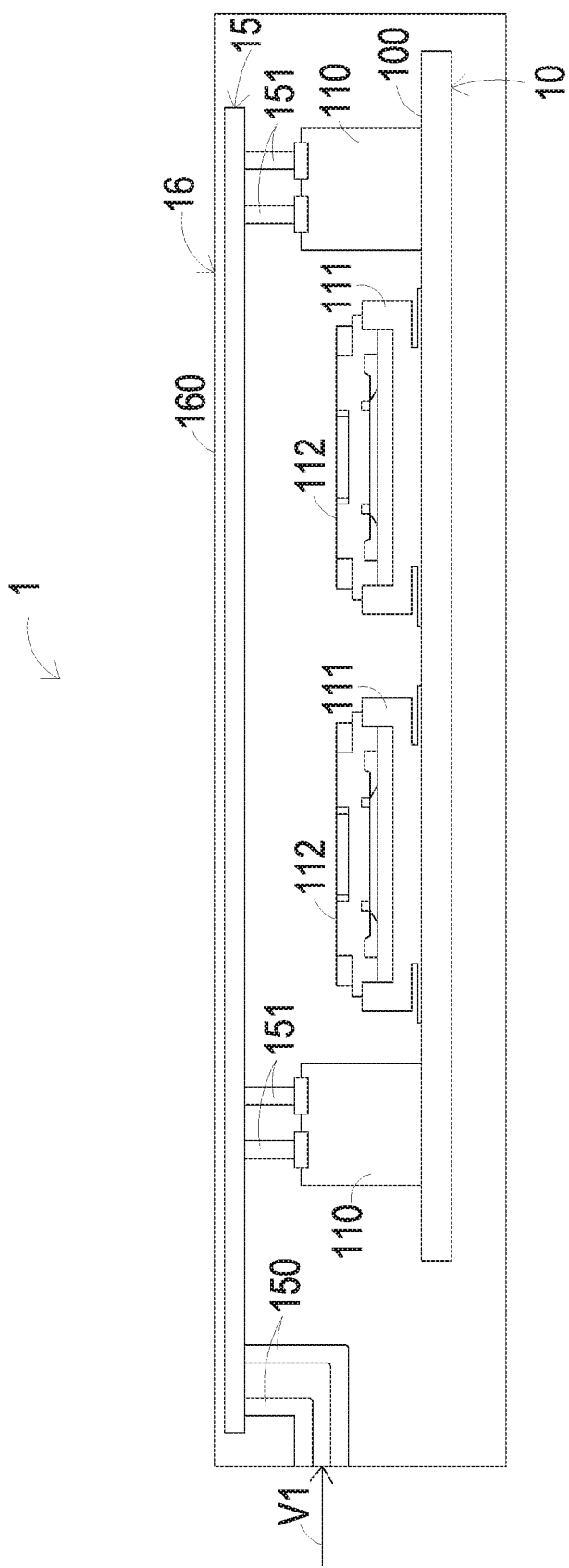
FIG. 7 is a schematic side view illustrating the layout of a third variant example of the power module of FIG. 3.

FIG. 7 is a schematic side view illustrating the layout of a third variant example of the power module of FIG. 3. In this embodiment, the power module 1 comprises plural first load groups 11. Moreover, the first-stage power conversion circuits 110 in at least two of the plural first load groups 11 are isolated resonant power conversion circuits. Due to the isolation efficacy of the first-stage power conversion circuits 110, the rated value of the first output voltage V1 is higher than 36V, and preferably higher than 60V. Since the first output voltage V1 is higher than 36V, the safety of the power module 1 needs to be further reinforced. Please refer to FIG. 7 again. The power module 1 further comprises a bus bar 15 and a casing 16. The casing 16 has an accommodation space. The first circuit board 10 and the electronic components on the first circuit board 10 (e.g., the first load groups 11) are accommodated within the accommodation space. The bus bar 15 is disposed within the accommodation space of the casing 16 and disposed on an inside of a top cover 160 of the casing 16. Moreover, the bus bar 15 is coated with an insulation layer (not shown). In an embodiment, the bus bar 15 comprises an input connection 150 and at least one output connections 151. The input connection 150 receives the first input voltage V1 from the power supply 17. The output connection 151 is electrically connected with the input terminal of the corresponding first-stage power conversion circuits 110. The bus bar 15 receives the first input voltage V1 through the input connection 150. Moreover, the first input voltage V1 is transmitted from the bus bar 15 to the input terminals of the first-stage power conversion circuits 110 through the output connection 151. Since the first input voltage V1 (i.e., a high voltage) is indirectly transmitted to the first-stage power conversion circuit 110 through the bus bar 15, the first input voltage V1 is not directly contacted with the first circuit board 10. Consequently, even if the first circuit board 10 is touched by the user, the user will not get electric shock. Moreover, since the first circuit board 10 is covered by the casing 16, the safety of the power module 1 is largely enhanced.

Preferably but not exclusively, the input connection 150 and the at least one output connection 151 of the bus bar 15 are respectively connected with the power supply 17 and the corresponding first-stage power conversion circuit 110 in an insertion manner. As mentioned above, the first-stage power conversion circuit 110 receives the high voltage. For further increasing the safety of the power module, the first-stage power conversion circuit 110 is included in a package structure.

Figure 8:
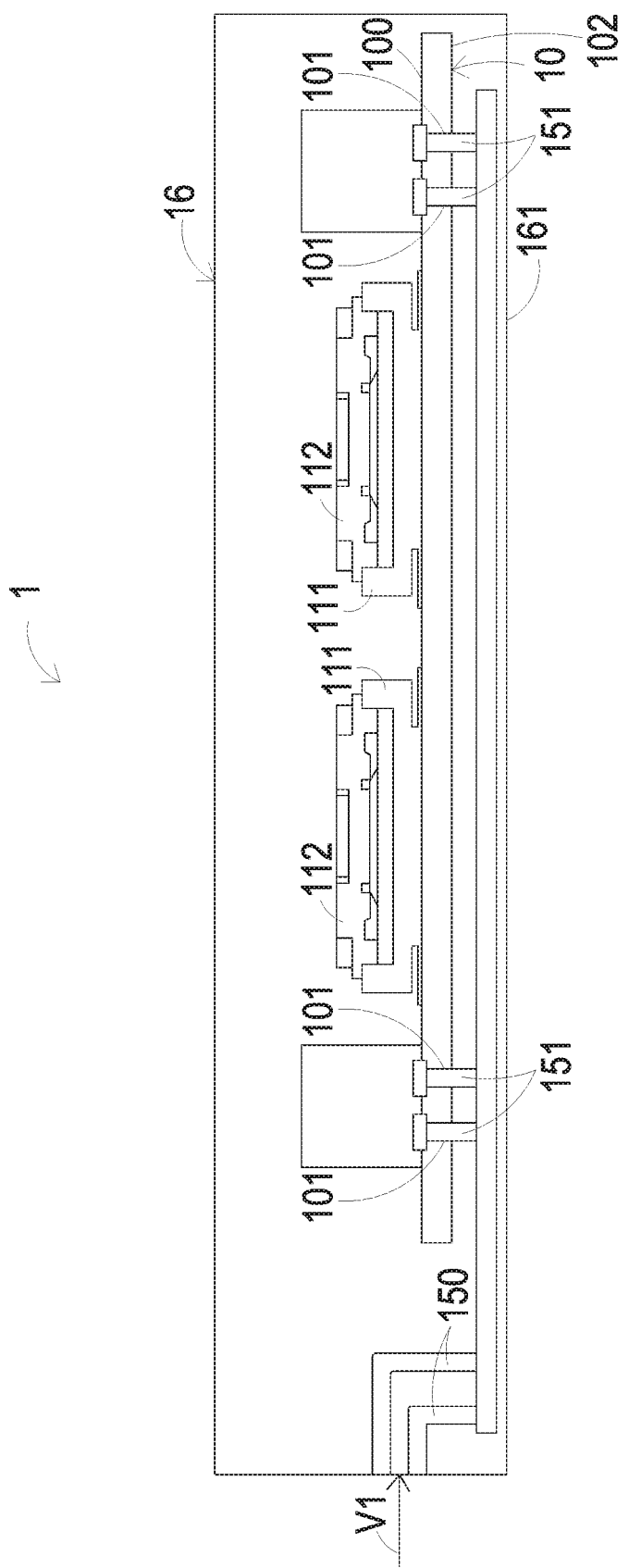
FIG. 8 is a schematic side view illustrating the layout of a fourth variant example of the power module of FIG. 3.

The position of the bus bar 15 is not restricted. FIG. 8 is a schematic side view illustrating the layout of a fourth variant example of the power module of FIG. 3. The bus bar 15 is also disposed within the accommodation space of the casing 16. In comparison with the example of FIG. 7, the bus bar 15 of this embodiment is disposed on an inside of a bottom cover 161 of the casing 16. Moreover, the first circuit board 10 comprises at least one perforation 101 corresponding to the at least one output connection 151. The output connection 151 is penetrated through the perforation 101 along the direction from a second surface 102 to the first surface 100 of the first circuit board 10, and electrically connected with the corresponding first-stage power conversion circuit 110.

Figure 9:
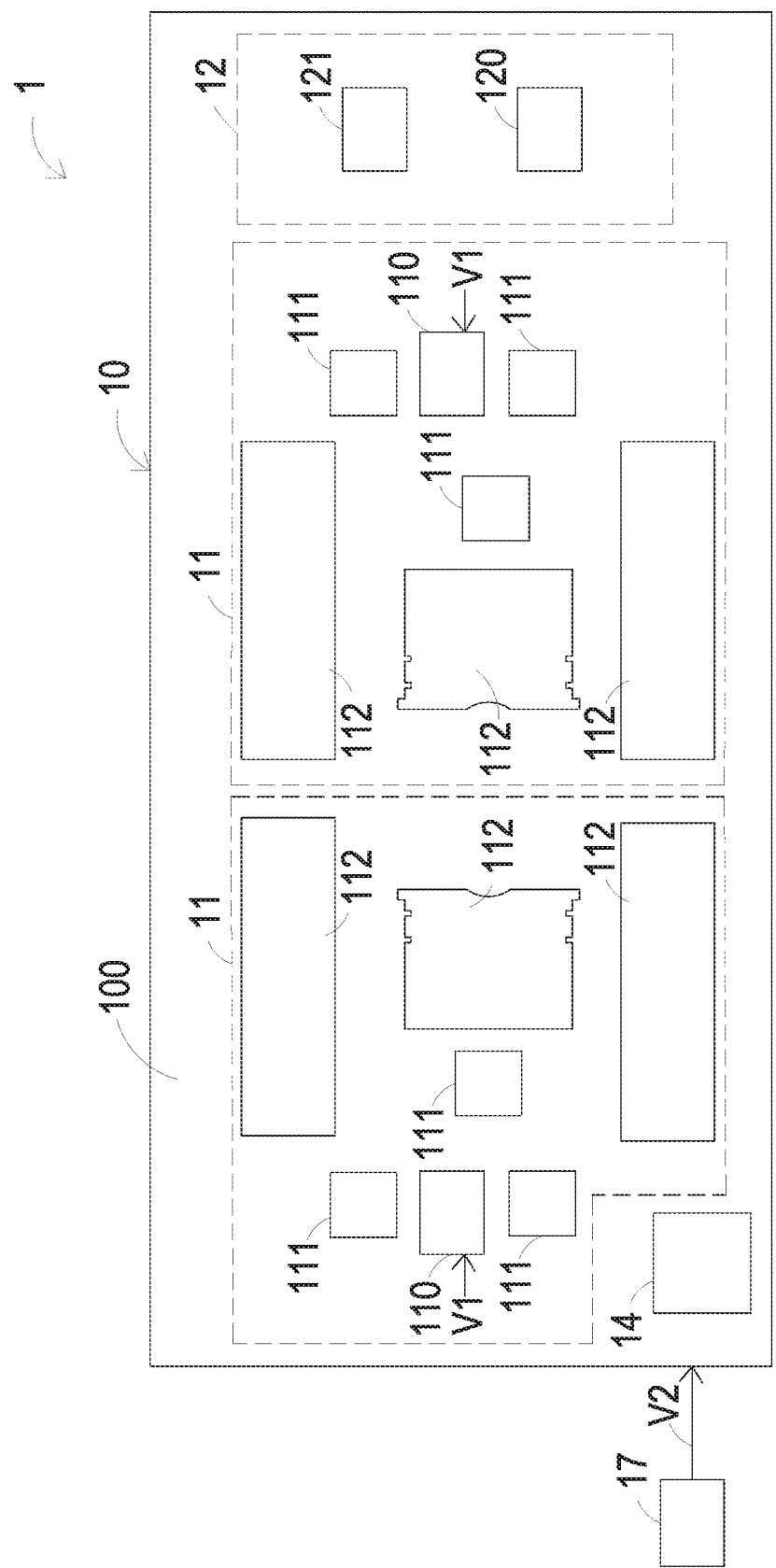
FIG. 9 is a schematic circuit block diagram illustrating the architecture of a fifth variant example of the power module of FIG. 3.

FIG. 9 is a schematic circuit block diagram illustrating the architecture of a fifth variant example of the power module of FIG. 3. In this embodiment, the power module 1 further comprises an input power conversion circuit 14. The input power conversion circuit 14 is installed on the first surface 100 of the first circuit board 10 and electrically connected between the power supply 17 and the input terminal of the first-stage power conversion circuit 110. Moreover, the power supply 17 outputs a second input voltage V2. The second input voltage V2 is higher than 200V. The input power conversion circuit 14 is used for receiving the second input voltage V2 and converting it into the first input voltage V1. For example, the rated value of the first input voltage V1 can be higher than 18V (typically 24V or 48V) or can be in the range between 8V and 18V (for example 12V). The first input voltage V1 is transmitted to the input terminal of the first-stage power conversion circuit 110.

Figure 10:
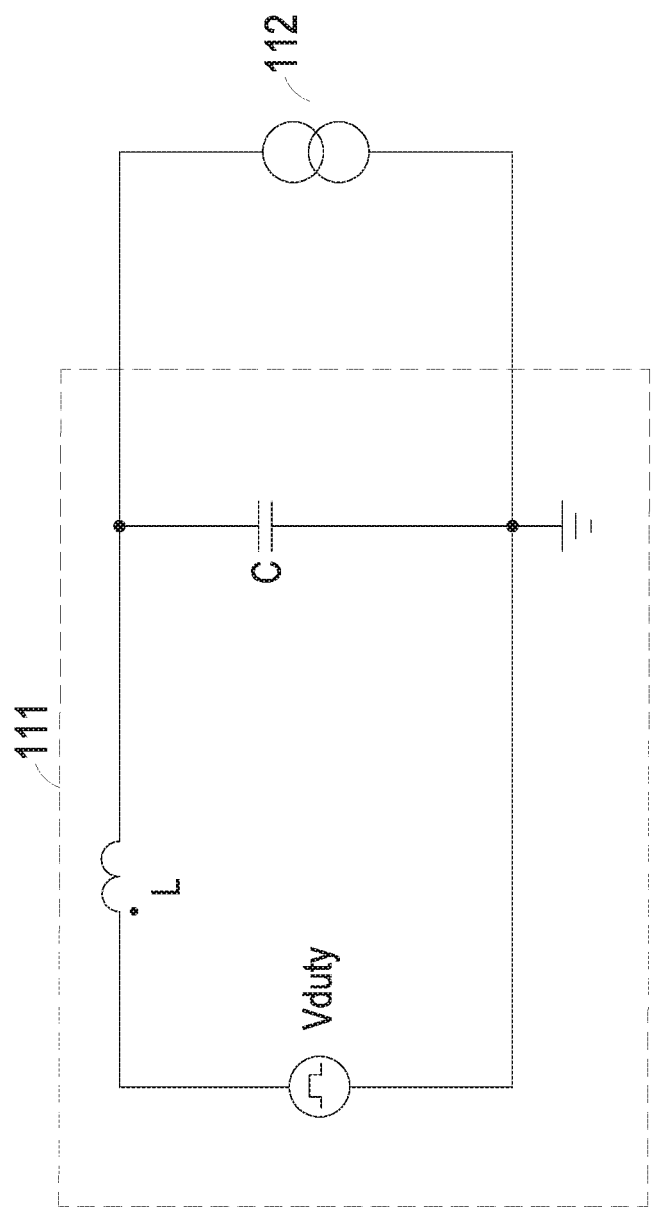
FIG. 10 is a schematic equivalent circuit of the second-stage power conversion circuit and the load of the power module as shown in FIG. 3.
Figure 11:
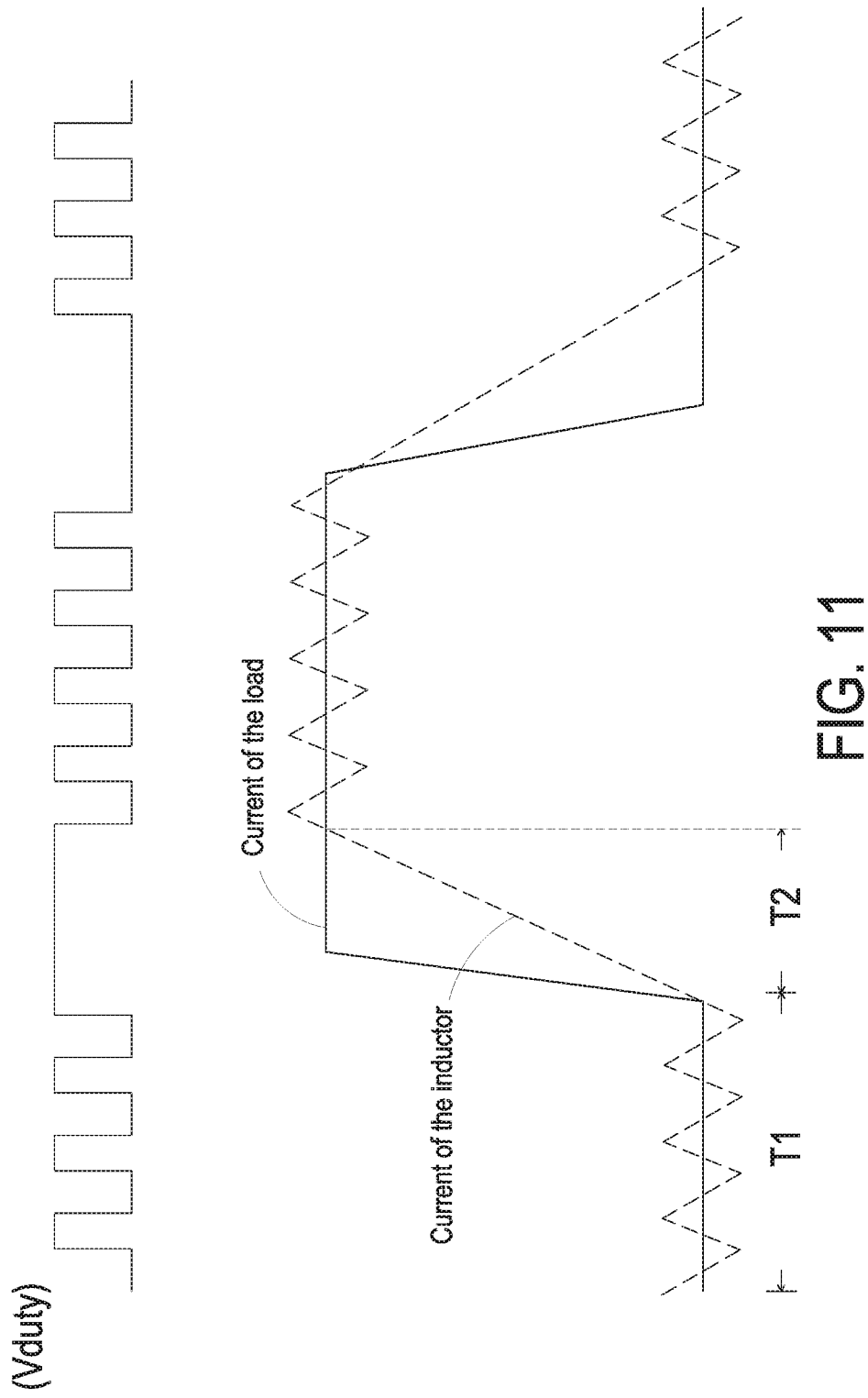
FIG. 11 is a schematic timing waveform diagram illustrating the square-wave voltage of the second-stage power conversion circuit, the current flowing through the inductor and the current flowing through the load as shown in FIGS. 3 and 10.

FIG. 10 is a schematic equivalent circuit of the second-stage power conversion circuit and the load of the power module as shown in FIG. 3. FIG. 11 is a schematic timing waveform diagram illustrating the square-wave voltage of the second-stage power conversion circuit, the current flowing through the inductor and the current flowing through the load as shown in FIGS. 3 and 10. The second-stage power conversion circuit 111 is equivalent to a square voltage Vduty with a variable duty cycle. The square-wave voltage is filtered by an inductor L and a capacitor C of the second-stage power conversion circuit 111 to obtain the driving voltage. The driving voltage is provided to the load 112. In a steady state of the second-stage power conversion circuit 111, the duty cycle of the square-wave voltage (i.e., duty=transition voltage/driving voltage) is a constant. In a dynamic state of the second-stage power conversion circuit 111, the maximum duty cycle is 100% or the minimum duty cycle is 0% in order to respond to the change of the load 112. Preferably, the current of the inductor L is identical to the current of the load 112. If the current of the inductor L is not identical to the current of the load 112, the capacitor C with sufficient capacitance is used to complement or absorb the energy difference. That is, if the current change capability di/dt for the current of the inductor L is stronger, the dynamic response is better and the capacitance of the capacitor C is lower. The current change capability di/dt is equal to (the transition voltage–the driving voltage)/the inductance of the inductor L.

Since the transition voltage received by the second-stage power conversion circuit 111 is decreased, the power module 1 of the present disclosure can achieve one of the above benefits. However, since the transition voltage is decreased, the difference between the transition voltage and the driving voltage is decreased. Under this circumstance, the current change capability di/dt is impaired and the dynamic response is deteriorated. As known, the reduction of the inductance of the inductor L can improve the dynamic response. However, if the inductance of the inductor L is decreased, the ripple current of the second-stage power conversion circuit 111 in the steady state increases and the power loss increases. For solving the above drawbacks, it is necessary to increase the inductance of the inductor L when the second-stage power conversion circuit 111 is in the steady state (e.g., in the time interval T1). When the second-stage power conversion circuit 111 is in the dynamic state (e.g., in the time interval T2), it is necessary to decrease the inductance of the inductor L to raise the dynamic response. Consequently, the current of the inductor L is adjusted to be substantially identical to the current of the load. To overcome the above-mentioned problems, the operations of the power module 1 will be described as follows.

Figure 12A:
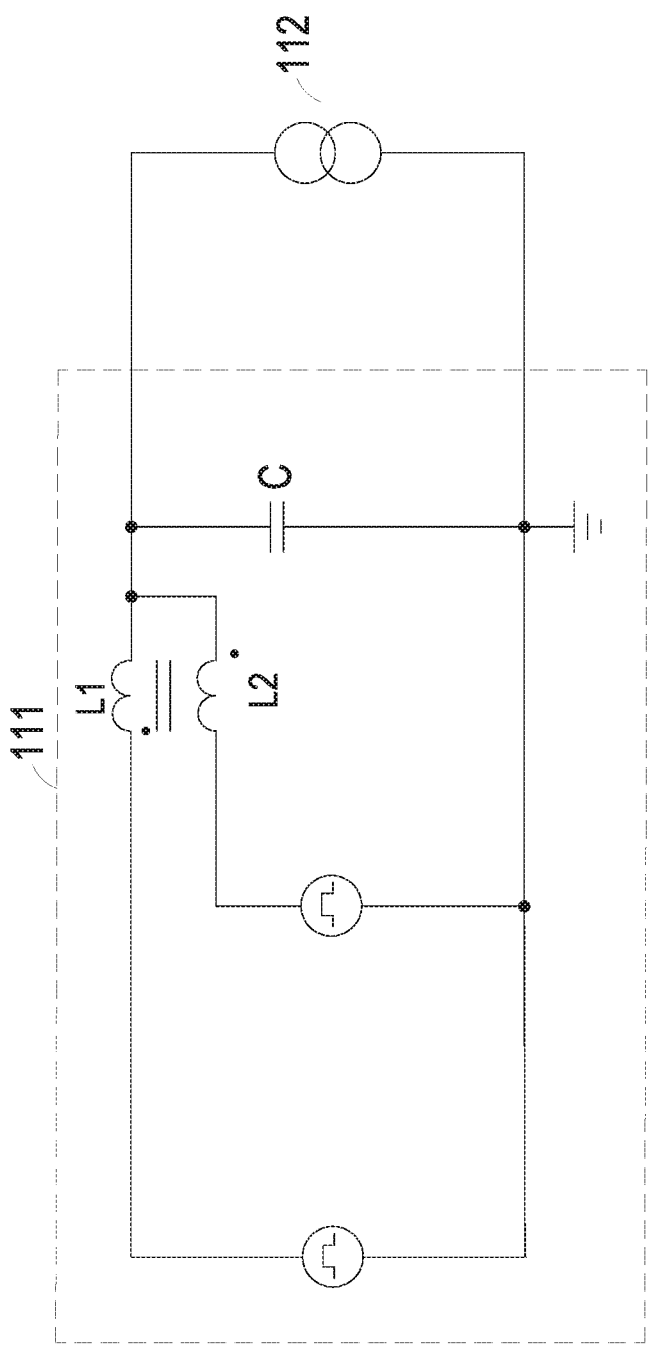
FIGS. 12A, 12B and 12C are schematic equivalent circuits of the second-stage power conversion circuit and the load of the power module as shown in FIG. 3 in different situations.
Figure 12B:
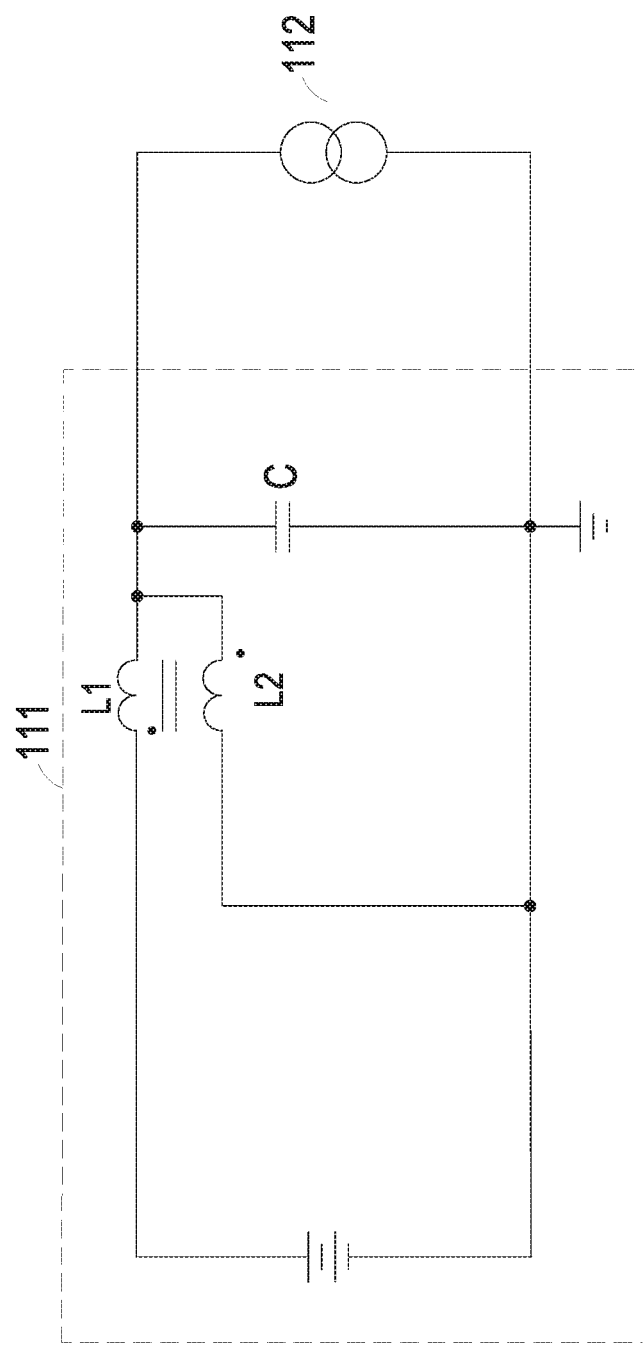
Figure 12C:
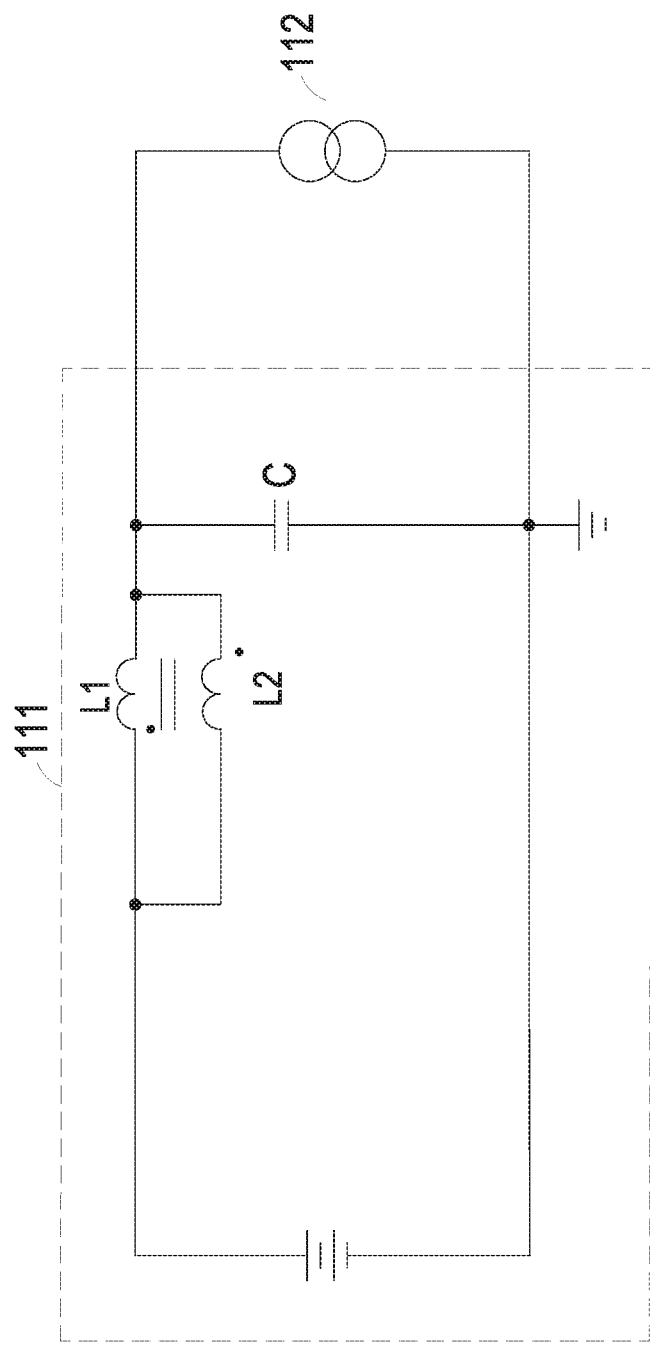

FIGS. 12A, 12B and 12C are schematic equivalent circuits of the second-stage power conversion circuit and the load of the power module as shown in FIG. 3 in different situations. In this embodiment, the second-stage power conversion circuit comprises plural buck converters. These buck converters are connected with each other in parallel. Moreover, the inductors of at least two buck converters share a magnetic material. The second-stage power conversion circuit 111 is capable of increasing the dynamic response and reducing the ripple current. Since the inductors of the at least two buck converters share the magnetic material, the inductors of the at least two buck converters are formed as an integrated inductor. In other words, the integrated inductor comprises at least two inductors.

As shown in FIG. 12A, the integrated inductor comprises a first inductor L1 and a second inductor L2. The first inductor L1 and the second inductor L2 are coupled in opposite directions. As shown in FIG. 12B, the second-stage power conversion circuit 111 is in a steady state. Since the phases of the plural buck converters are not consistent, the first inductor L1 and the second inductor L2 are equivalently connected with each other in series. Under this circumstance, the overall inductance is increased and the ripple current of the second-stage power conversion circuit 111 in the steady state is decreased. As shown in FIG. 12C, the second-stage power conversion circuit 111 is in a dynamic state. The input terminal of the inductor L1 and the input terminal of the inductor L2 are equivalently connected together, which is equivalent to the same potential. That is, the two inductors L1 and L2 are short-circuited. As for the impedance between the transition voltage and the driving voltage of the second-stage power conversion circuit 111, only the leakage inductance of the coupled inductors L1 and L2 exists and the dynamic inductance is very low, so the dynamic response is increased.

Figure 13A:
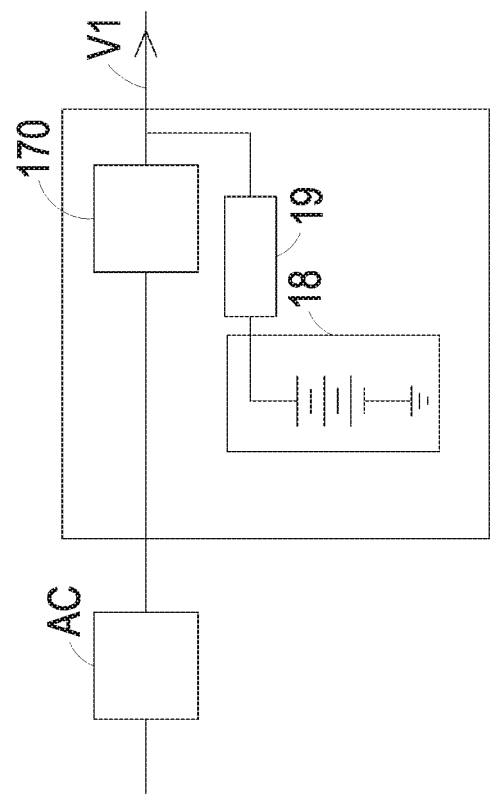
FIG. 13A is schematic circuit diagram of a conventional power supply.
Figure 13B:
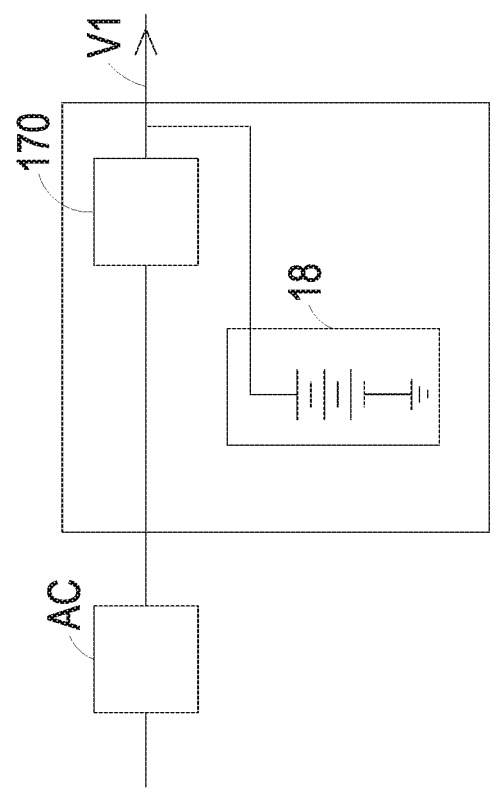
FIG. 13B is schematic circuit diagram of the power supply for the power module as shown in FIG. 3.

FIG. 13A is schematic circuit diagram of a conventional input power supply. FIG. 13B is schematic circuit diagram of the power supply for the power module as shown in FIG. 3. As mentioned above, the first-stage power conversion circuit 110 does not need to have the strong voltage-adjusting capability. In some situations, the first-stage power conversion circuit 110 does not need to have the function of adjusting the transition voltage. In other words, the transition voltage received by the second-stage power conversion circuit 111 is unstable. However, the dynamic response has to reach the desired level in the complete working voltage range. As mentioned above, the current change capability di/dt is equal to (the transition voltage–the driving voltage)/the inductance of the inductor L. The dynamic response capability is determined according to the minimum value of the transition voltage. As mentioned above, the first input voltage V1 from the power supply 17 can be in the range between 8V and 18V (for example 12V) or higher than 18V (typically 24V or 48V).

As shown in FIG. 13A, the conventional power supply 17 receives AC power. Moreover, the conventional power supply 17 comprises a power source conversion circuit 170 and a battery 18. The first input voltage V1 may be provided by the battery 18. That is, the first input voltage V1 is determined according to the voltage of the battery 18. Generally, the voltage range of the battery 18 (e.g., a lithium battery) is very large (e.g., in the range between 40V and 60V). If the voltage range is between 40V and 60V, the voltage range coefficient of the first input voltage V1 is 1.5 (i.e., 60V/40V=1.5) and the voltage range coefficient of the transition voltage is also 1.5. The large voltage range coefficient is detrimental to the dynamic response control of the second-stage power conversion circuit 111.

For solving the above drawbacks, the power supply 17 as shown in FIG. 13B further comprises a buck-boost bidirectional power conversion circuit 19. The buck-boost bidirectional power conversion circuit 19 is electrically connected with the output terminal of the battery 18 for converting the battery voltage into the first input voltage V1. Due to the buck-boost bidirectional power conversion circuit 19, the first input voltage V1 is not influenced by the status of the battery 18. Consequently, the voltage range coefficient of the first input voltage V1 is narrowed, for example lower than 1.3. Under this circumstance, the dynamic response control of the second-stage power conversion circuit 111 is better.

As mentioned above, the first input voltage V1 is not influenced by the status of the battery 18 because of the buck-boost bidirectional power conversion circuit 19. Since the second-stage power conversion circuit 111 has stronger voltage-adjusting capability, the ripple voltage of the first input voltage V1 can be larger. Under this circumstance, the power source conversion circuit 170 can be designed to have a loose-adjusting function or no adjusting function.

Figure 14:
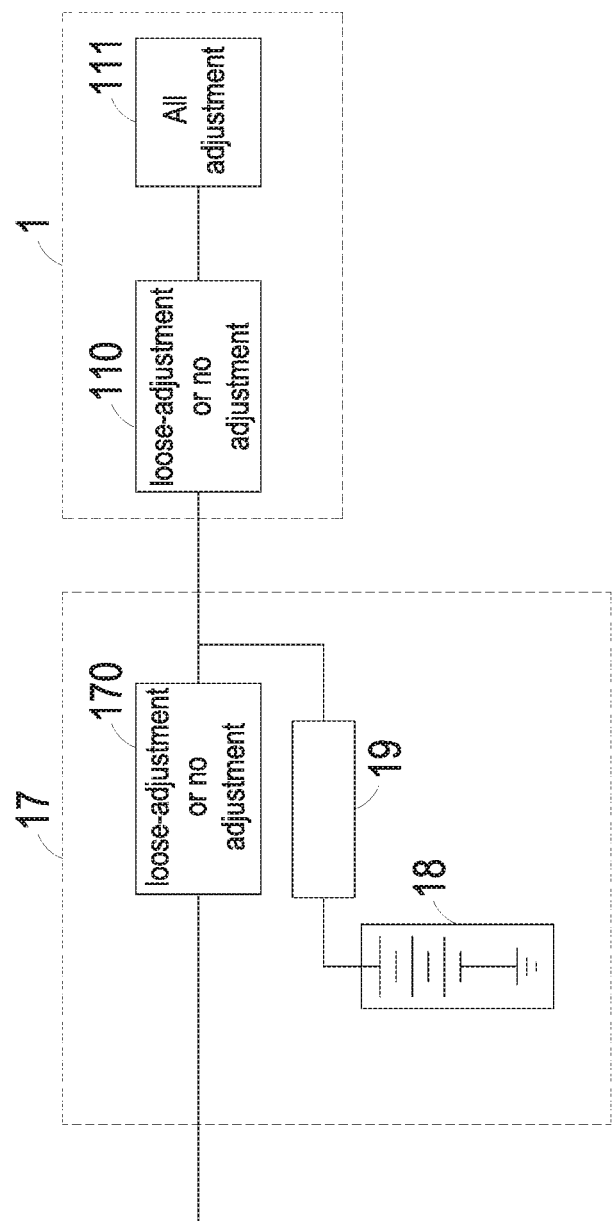
FIG. 14 is a schematic circuit diagram illustrating the relationship between the power supply of FIG. 13B and the power module of FIG. 3.

FIG. 14 is a schematic circuit diagram illustrating the relationship between the power supply of FIG. 13B and the power module of FIG. 3. As shown in FIG. 14, the power source conversion circuit 170 and the first-stage power conversion circuit 110 are resonant LLC circuit having the loose-adjusting function or no adjusting function, and the second-stage power conversion circuit 111 has the full adjusting function.

Figure 15:
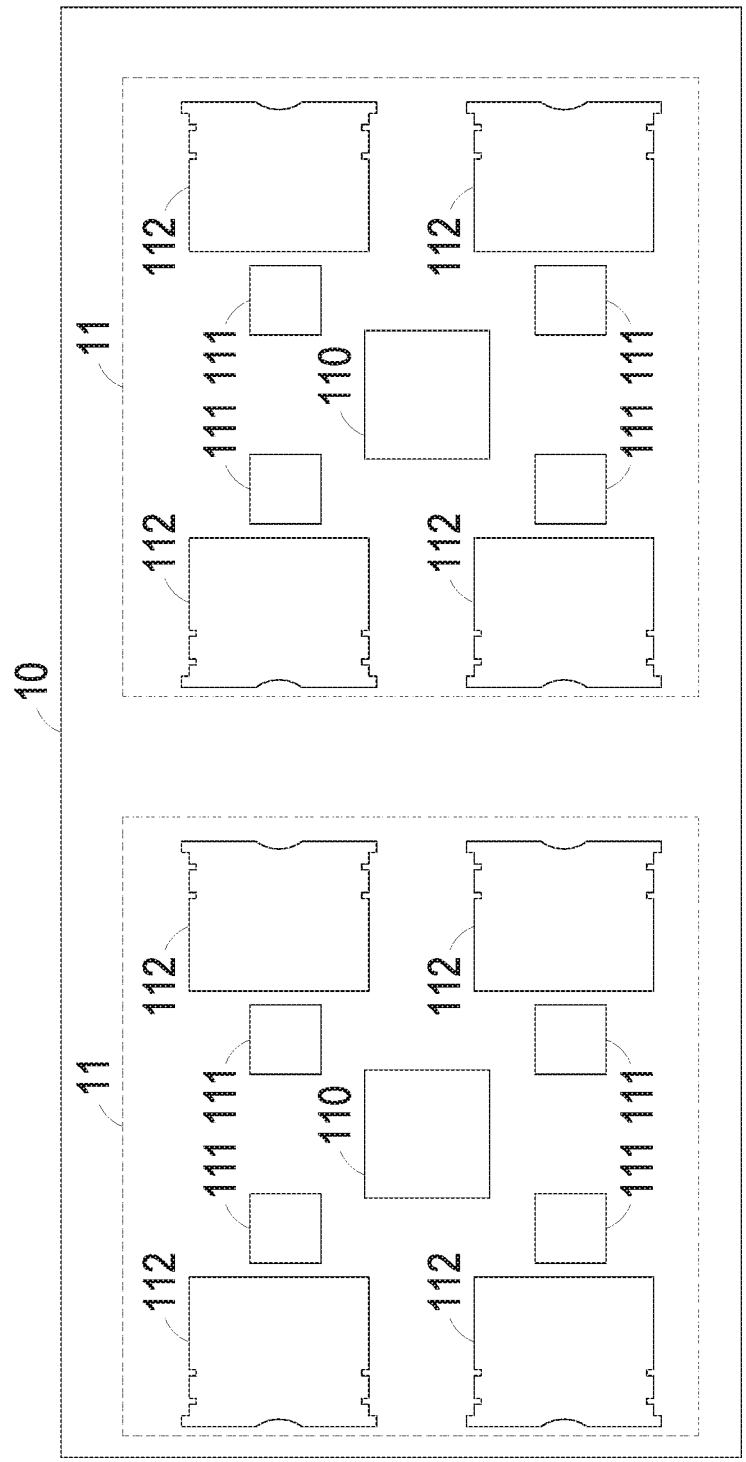
FIG. 15 is a schematic circuit block diagram illustrating the architecture of a sixth variant example of the power module of FIG. 3.

It is noted that the installation positions of the loads 112, the first-stage power conversion circuit 110 and the second-stage power conversion circuit 111 of each first load group 11 are not restricted. FIG. 15 is a schematic circuit block diagram illustrating the architecture of a sixth variant example of the power module. In this embodiment, the plural loads 112 are arranged around the POL conversion module, which is composed of the first-stage power conversion circuit 110 and at least one second-stage power conversion circuit 111.

The architecture of FIG. 3 is suitable for the first load group 11 composed of a CPU and a corresponding DDR. The architecture of FIG. 15 is suitable for a server or a large-sized communication device with multiple (e.g., four) CPUs. It is noted that the layout structure of the loads and the power supply may be varied according to the practical requirements. The concepts of the present disclosure can be effective to provide succinct and aesthetically-pleasing layout structure of the main board, which is benefit to structure design and heat dissipation.

Figure 16:
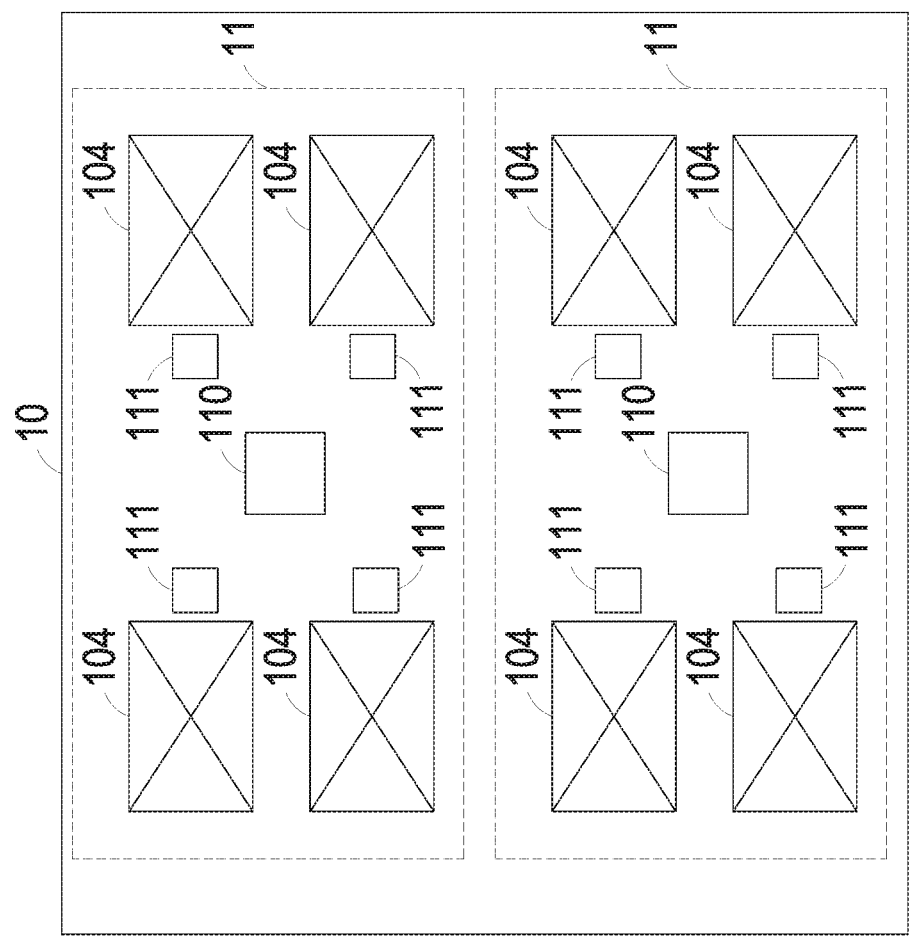
FIG. 16 is a schematic circuit block diagram illustrating the architecture of a seventh variant example of the power module of FIG. 3.

FIG. 16 is a schematic circuit block diagram illustrating the architecture of a seventh variant example of the power module. In this embodiment, the first circuit board 10 further comprises plural insertion slots 104 corresponding to the plural loads 112 of the first load group 11. As shown in FIG. 16, the two first load groups 11 contain a total of eight loads 112. Consequently, the first circuit board 10 comprises eight insertion slots 104 corresponding to the eight loads 112. In this embodiment, the insertion slots 104 are arranged around the POL conversion module. Moreover, the loads 112 are inserted into the corresponding insertion slots 104.

Figure 17:
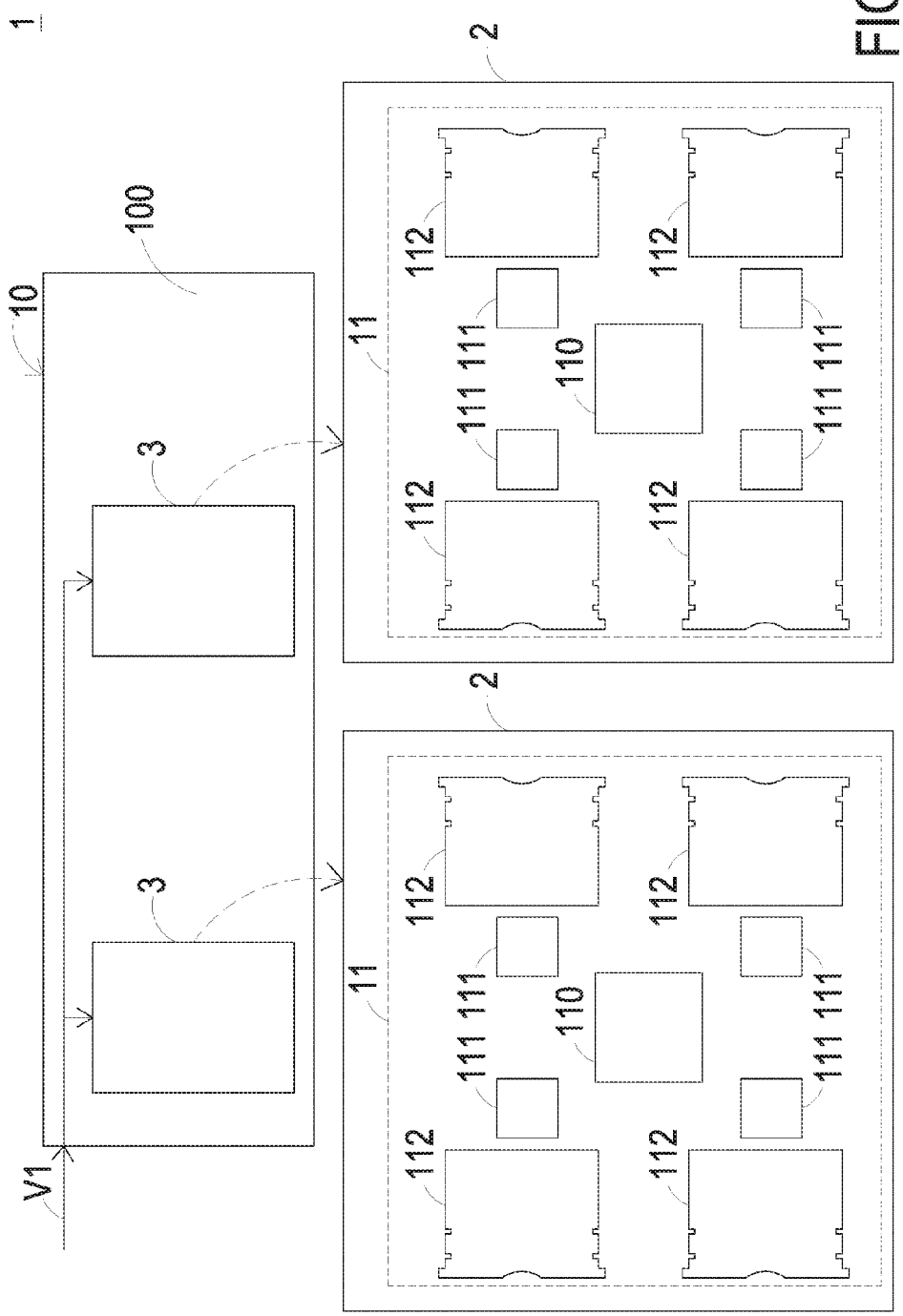
FIG. 17 is a schematic circuit block diagram illustrating the architecture of an eighth variant example of the power module of FIG. 3.

FIG. 17 is a schematic circuit block diagram illustrating the architecture of an eighth variant example of the power module. In this embodiment, the power module 1 further comprises a second circuit board 2. The first load group 11 is installed on the second circuit board 2. Consequently, the first load group 11 and the second circuit board 2 are collaboratively formed as a function card 3. The function card 3 is inserted into the first surface 100 of the first circuit board 10. For example, the function card 3 is a data processor such as a graphics processor. Preferably, plural function cards 3 can be inserted into the first surface 100 of the first circuit board 10. The inner circuitry of the first load group 11 as shown in FIG. 17 is identical to the inner circuitry of the first load group 11 as shown in FIG. 15, and is not redundantly described herein. The first input voltage V1 is transmitted to the input terminal of the first-stage power conversion circuit 110 through the traces of the first circuit board 10 and the second circuit board 2.

In the embodiment of FIG. 17, the first circuit board 10 may be considered as a main board. Consequently, many high-power function cards can be installed on the main board. The high-power function card is equipped with many electronic components. Under this circumstance, the main board does not need to be equipped with many electronic components. After the plural function cards are inserted into the main card, these function cards can be in communication with each other and in communication with the external devices. In an embodiment, one load group is installed on one function card.

Figure 18:
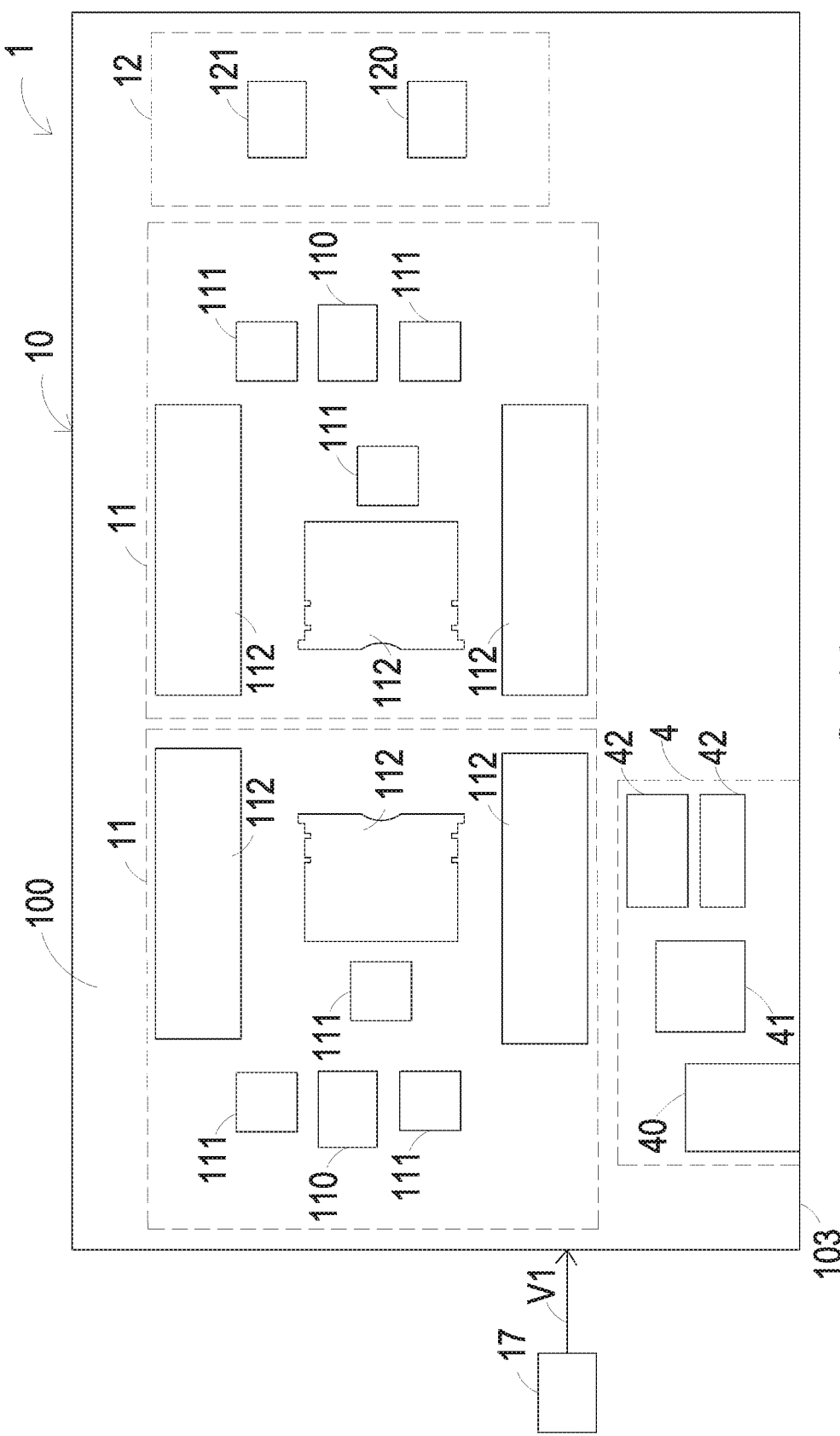
FIG. 18 is a schematic circuit block diagram illustrating the architecture of a ninth variant example of the power module of FIG. 3.

FIG. 18 is a schematic circuit block diagram illustrating the architecture of a ninth variant example of the power module. In this embodiment, the power module 1 further comprises a third load group 4. The third load group 4 is installed on an edge 103 of the first surface 100 of the first circuit board 10. In an embodiment, the third load group 4 comprises a first-stage power conversion circuit 40, at least one second-stage power conversion circuit 41 and plural loads 42.

The first-stage power conversion circuit 40 is installed on the edge 103. The input terminal of the first-stage power conversion circuit 40 receives the first input voltage V1 through the corresponding traces of the first circuit board 10. The first-stage power conversion circuit 40 is used for converting the first input voltage V1 into a transition voltage. The transition voltage is outputted from an output terminal of the first-stage power conversion circuit 40.

The at least one second-stage power conversion circuit 41 is located near the first-stage power conversion circuit 40. The input terminal of the second-stage power conversion circuit 41 is electrically connected with the output terminal of the first-stage power conversion circuit 40 through the corresponding traces of the first circuit board 10. Consequently, the second-stage power conversion circuit 41 receives the transition voltage from the first-stage power conversion circuit 40. The second-stage power conversion circuit 41 is used for converting the transition voltage into a driving voltage. The driving voltage is outputted from the output terminal of the second-stage power conversion circuit 41.

Moreover, the rated value of the first input voltage V1 is higher than twice the rated value of the transition voltage from the first-stage power conversion circuit 40, and the rated value of the driving voltage from the second-stage power conversion circuit 41 is lower than a half of the rated value of the transition voltage.

In this embodiment, the third load group 4 comprises two loads 42. These loads 42 are installed on the first surface 100 of the first circuit board 10. The output terminal of each second-stage power conversion circuit 41 is electrically connected with the corresponding load 42 through the corresponding traces of the first circuit board 10. The driving voltage is transmitted from the second-stage power conversion circuit 41 to the corresponding load 42. Consequently, the load 42 can be normally operated.

In an embodiment, the power module 1 comprises two first load groups 11 and one third load group 4. For reducing the power loss of the power module 1, the resistance between the output terminal of the first-stage power conversion circuit 110 and the input terminal of the at least one second-stage power conversion circuit 111 with the highest rated power in each first load group 11 is lower than the resistance between the output terminal of the first-stage power conversion circuit 110 of the first load group 11 and the output terminal of the first-stage power conversion circuit 40 of the third load group 4.

In another embodiment, the power module 1 also comprises two first load groups 11 and one third load group 4. For reducing the power loss of the power module 1, the resistance between the output terminal of the first-stage power conversion circuit 110 and the input terminal of the at least one second-stage power conversion circuit 111 with the highest rated power in each first load group 11 is lower than the resistance between the input terminal of the first-stage power conversion circuit 110 of the first load group 11 and the input terminal of the first-stage power conversion circuit 40 of the third load group 4.

From the above descriptions, the present disclosure provides the power module. Since the voltage level of the first input voltage received by the first circuit board increases, the power loss of the traces of the first circuit board is reduced and the efficiency of the power module is enhanced. Moreover, since the voltage difference between the input terminal and the output terminal of the second-stage power conversion circuit is decreased, the efficiency of the second-stage power conversion circuit is largely enhanced. Moreover, the distance between the input terminal of the at least one second-stage power conversion circuit with the highest rated power and the output terminal of the first-stage power conversion circuit is smaller than the distance between the input terminal of the first-stage power conversion circuit and each edge of the circuit board. Since the electric transmission path between the first-stage power conversion circuit and the second-stage power conversion circuit is shorter, the power loss is reduced and the working efficiency is enhanced when the transition voltage is transmitted from the first-stage power conversion circuit to the second-stage power conversion circuit through the corresponding traces of the first circuit board. Moreover, since the rated value of the transition voltage is in the range between 2V and 8V, the semiconductor components operated at 2V~8V can be used as the switching elements of the second-stage power conversion circuit. Under this circumstance, the working frequency of the second-stage power conversion circuit largely increases while maintaining the desired efficiency. Moreover, since the volume of the second-stage power conversion circuit is reduced, the power loss of the traces of the first circuit board is reduced. Moreover, since the ability of the second-stage power conversion circuit to quickly adjust the output voltage is achieved, the power loss of the load is reduced. Moreover, since the second-stage power conversion circuit used in the power module is the buck converter corresponding to the low voltage, the second-stage power conversion circuit has stronger voltage-adjusting capability. That is, the volume of the second-stage power conversion circuit can be flexibly varied according to the overall power level, and the transition voltage received by the second-stage power conversion circuit can have large fluctuation. On the other hand, the first-stage power conversion circuit does not need to have the strong voltage-adjusting capability. Since the characteristics of the components, controllers, loads and the system are well utilized, the power module of the present disclosure can be applied to various environments.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
a first circuit board; and
at least one first load group installed on a first surface of the first circuit board, wherein each first load group comprises:
  a first-stage power conversion circuit installed on the first surface of the first circuit board, wherein an input terminal of the first-stage power conversion circuit receives a first input voltage, the first input voltage is converted into a transition voltage by the first-stage power conversion circuit, and the transition voltage is outputted from an output terminal of the first-stage power conversion circuit;
  at least one second-stage power conversion circuit installed on the first surface of the first circuit board and located near the first-stage power conversion circuit, wherein an input terminal of the second-stage power conversion circuit is electrically connected with the output terminal of the first-stage power conversion circuit to receive the transition voltage, the transition voltage is converted into a driving voltage by the second-stage power conversion circuit, and the driving voltage is outputted from an output terminal of the second-stage power conversion circuit; and
  plural loads installed on the first surface of the first circuit board, wherein the output terminal of each second-stage power conversion circuit is connected with the corresponding load, and each load receives the driving voltage from the corresponding second-stage power conversion circuit;
  wherein a rated value of the first input voltage is higher than twice a rated value of the transition voltage, and a rated value of the driving voltage is lower than a half of the rated value of the transition voltage, and a distance between the input terminal of the at least one second-stage power conversion circuit with the highest rated power and the output terminal of the first-stage power conversion circuit is smaller than a distance between the input terminal of the first-stage power conversion circuit and each edge of the circuit board.

2. The power module according to claim 1, wherein the power module comprises two first load groups, wherein a resistance between the output terminal of the first-stage power conversion circuit and the input terminal of the at least one second-stage power conversion circuit with the highest rated power in each first load group is lower than a resistance between the output terminals of the two first-stage power conversion circuits of the two first load groups.

3. The power module according to claim 1, wherein the power module comprises two first load groups, wherein a resistance between the output terminal of the first-stage power conversion circuit and the input terminal of the at least one second-stage power conversion circuit with the highest rated power in each first load group is lower than a resistance between the input terminals of the two first-stage power conversion circuits of the two first load groups.

4. The power module according to claim 1, wherein the rated value of the first input voltage is in the range between 8V and 18V, the rated value of the transition voltage is in the range between 2V and 8V.

5. The power module according to claim 1, wherein the rated value of the first input voltage is at least 18V, the rated value of the transition voltage is in a range between 3V and 8V, and the overall required power of the at least one first load group is at least 50% of the overall required power of the first circuit board.

6. The power module according to claim 1, wherein the plural loads of each first load group are included in a data processing chip, and a highest current provided to the data processing chip is at least 30 A.

7. The power module according to claim 1, wherein a gain over full load range of the first-stage power conversion circuit is lower than 1.2, and a gain over full load range of the second-stage power conversion circuit is higher than 1.2.

8. The power module according to claim 1, wherein the second-stage power conversion circuit comprises plural switching elements and a driving element for driving the plural switching elements, wherein the plural switching elements and the driving element are integrated into a silicon chip by a lateral semiconductor manufacturing process.

9. The power module according to claim 1, wherein each first load group comprises at least two second-stage power conversion circuits, and among the at least two second-stage power conversion circuits, the maximum rated value of an output current is at least five times the minimum rated value of the output current.

10. The power module according to claim 9, wherein the second-stage power conversion circuit comprises plural buck converters, which are connected with each other in parallel, wherein inductors of at least two buck converters share a magnetic material, so that the inductors are collaboratively formed as an integrated inductor.

11. The power module according to claim 10, wherein the integrated inductor comprises a first inductor and a second inductor, wherein the first inductor and the second inductor are coupled in opposite directions.

12. The power module according to claim 9, wherein at least one of the at least two second-stage power conversion circuits is located over the corresponding load and included in a package structure along with the corresponding load.

13. The power module according to claim 1, further comprising a second load group, wherein the second load group is installed on the first surface of the first circuit board, and the second load group comprises:
an additional first-stage power conversion circuit installed on the first surface of the first circuit board, wherein an input terminal of the additional first-stage power conversion circuit receives the first input voltage, the first input voltage is converted into an additional transition voltage by the additional first-stage power conversion circuit, and the additional transition voltage is outputted from an output terminal of the additional first-stage power conversion circuit; and
a hard drive connected with the output terminal of the additional first-stage power conversion circuit, wherein the hard drive is powered by the additional transition voltage,
wherein the rated value of the first input voltage is higher than twice a rated value of the additional transition voltage.

14. The power module according to claim 1, wherein the power module comprises plural first load groups, and the first-stage power conversion circuits in at least two of the plural first load groups are isolated resonant power conversion circuits, wherein the first input voltage is inputted from a power supply, and the rated value of the first input voltage is higher than 36V.

15. The power module according to claim 14, wherein the power module further comprises a bus bar and a casing, the first circuit board is covered by the casing, and the bus bar is disposed on an inner surface of a top cover of the casing, wherein the bus bar comprises an input connection and at least one output connection, the input connection is electrically connected with the power supply, the output connection is electrically connected with the first-stage power conversion circuit of each first load group, the bus bar receives the first input voltage through the input connection, and the first input voltage is transmitted from the bus bar to the first-stage power conversion circuit through the output connection.

16. The power module according to claim 14, wherein the power module further comprises a bus bar and a casing, the first circuit board is covered by the casing, and the bus bar is disposed on an inner surface of a bottom cover of the casing, wherein the bus bar comprises an input connection and at least one output connection, the input connection is electrically connected with the power supply, the output connection is penetrated through a perforation of the first circuit board and electrically connected with the first-stage power conversion circuit of each first load group, the bus bar receives the first input voltage through the input connection, and the first input voltage is transmitted from the bus bar to the first-stage power conversion circuit through the output connection.

17. The power module according to claim 1, wherein the power module further comprises a power source conversion circuit, wherein the power source conversion circuit is installed on the first surface of the first circuit board and electrically connected between a power supply and the first-stage power conversion circuit, the power source conversion circuit receives a second input voltage from the power supply, and the power source conversion circuit converts the second input voltage into the first input voltage, wherein the second input voltage is higher than 200V.

18. The power module according to claim 1, wherein the first input voltage is provided by a power supply, and the power supply comprises a battery and a buck-boost bidirectional power conversion circuit, wherein the buck-boost bidirectional power conversion circuit is electrically connected with the battery, and a battery voltage is converted into the first input voltage by the buck-boost bidirectional power conversion circuit.

19. The power module according to claim 1, wherein the power module further comprises a second circuit board, and the second circuit board and the first load group are collaboratively formed as a function card, wherein the function card is inserted into the first circuit board, and the function card is a data processor.

20. The power module according to claim 1, wherein a length of an electric transmission path between the first-stage power conversion circuit and the second-stage power conversion circuit is smaller than 5 centimeters.

21. The power module according to claim 1, further comprising a third load group, wherein the third load group is installed on an edge of the first circuit board, and the third load group comprises:
an additional first-stage power conversion circuit installed on the edge of the first circuit board, wherein an input terminal of the additional first-stage power conversion circuit receives the first input voltage, the first input voltage is converted into an additional transition voltage by the additional first-stage power conversion circuit, and the additional transition voltage is outputted from an output terminal of the additional first-stage power conversion circuit;
at least one additional second-stage power conversion circuit located near the additional first-stage power conversion circuit, wherein an input terminal of the additional second-stage power conversion circuit is electrically connected with the output terminal of the additional first-stage power conversion circuit to receive the transition voltage, the additional transition voltage is converted into an additional driving voltage by the additional second-stage power conversion circuit, and the additional driving voltage is outputted from an output terminal of the additional second-stage power conversion circuit,
plural additional loads, wherein the output terminal of each additional second-stage power conversion circuit is connected with the corresponding additional load, and each additional load receives the additional driving voltage from the corresponding additional second-stage power conversion circuit, wherein the rated value of the first input voltage is higher than twice a rated value of the additional transition voltage, and a rated value of the additional driving voltage is lower than a half of the rated value of the additional transition voltage.

22. The power module according to claim 21, wherein a resistance between the output terminal of the first-stage power conversion circuit and the input terminal of the at least one second-stage power conversion circuit with the highest rated power in each first load group is lower than a resistance between the output terminal of the first-stage power conversion circuit in each first load group and the output terminal of the first-stage power conversion circuit in the third load group.

23. The power module according to claim 21, wherein a resistance between the output terminal of the first-stage power conversion circuit and the input terminal of the at least one second-stage power conversion circuit with the highest rated power in each first load group is lower than a resistance between the input terminal of the first-stage power conversion circuit in each first load group and the input terminal of the first-stage power conversion circuit in the third load group.

24. The power module according to claim 1, wherein the first-stage power conversion circuit and the at least one second-stage power conversion circuit of each first load group are collaboratively formed as a point-of-load conversion module, and the plural loads are arranged around the point-of-load conversion module.

25. The power module according to claim 1, wherein the first circuit board further comprises plural insertion slots corresponding to the plural loads of the first load group.

26. A power module, comprising:
a first circuit board; and
at least two first load groups installed on a first surface of the first circuit board, wherein each first load group comprises:
a first-stage power conversion circuit installed on the first surface of the first circuit board, wherein an input terminal of the first-stage power conversion circuit receives a first input voltage, the first input voltage is converted into a transition voltage by the first-stage power conversion circuit, and the transition voltage is outputted from an output terminal of the first-stage power conversion circuit;
at least one second-stage power conversion circuit installed on the first surface of the first circuit board and located near the first-stage power conversion circuit, wherein an input terminal of the second-stage power conversion circuit is electrically connected with the output terminal of the first-stage power conversion circuit to receive the transition voltage, the transition voltage is converted into a driving voltage by the second-stage power conversion circuit, and a driving voltage is outputted from an output terminal of the second-stage power conversion circuit; and
plural loads installed on the first surface of the first circuit board, wherein the output terminal of each second-stage power conversion circuit is connected with the corresponding load, and each load receives the driving voltage from the corresponding second-stage power conversion circuit;
wherein a rated value of the first input voltage is higher than twice a rated value of the transition voltage, a rated value of the driving voltage is lower than a half of the rated value of the transition voltage, and a resistance between the output terminal of the first-stage power conversion circuit and the input terminal of the at least one second-stage power conversion circuit with the highest rated power in each first load group is lower than a resistance between the output terminals of the two first-stage power conversion circuits of the two first load groups.

27. The power module according to claim 26, wherein the power module comprises two first load groups, wherein a resistance between the output terminal of the first-stage power conversion circuit and the input terminal of the at least one second-stage power conversion circuit with the highest rated power in each first load group is lower than a resistance between the input terminals of the two first-stage power conversion circuits of the two first load groups.

28. The power module according to claim 26, wherein the at least one second-stage power conversion circuit of each first load group comprises plural second-stage power conversion circuits, and the output terminal of the first-stage power conversion circuit is electrically connected with the output terminals of the plural second-stage power conversion circuits.

* * * * *